United States Patent
Kurata et al.

(10) Patent No.: US 12,557,416 B2
(45) Date of Patent: Feb. 17, 2026

(54) LIGHT RECEPTION ELEMENT AND ELECTRONIC DEVICE

(71) Applicant: Sony Semiconductor Solutions Corporation, Kanagawa (JP)

(72) Inventors: Kenji Kurata, Kanagawa (JP); Yusuke Otake, Kanagawa (JP); Shohei Shimada, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 520 days.

(21) Appl. No.: 18/010,373

(22) PCT Filed: Jul. 7, 2021

(86) PCT No.: PCT/JP2021/025619
§ 371 (c)(1),
(2) Date: Dec. 14, 2022

(87) PCT Pub. No.: WO2022/019116
PCT Pub. Date: Jan. 27, 2022

(65) Prior Publication Data
US 2023/0268365 A1 Aug. 24, 2023

(30) Foreign Application Priority Data

Jul. 21, 2020 (JP) ................................ 2020-124179

(51) Int. Cl.
*H10F 39/00* (2025.01)
*H10F 39/18* (2025.01)

(52) U.S. Cl.
CPC ......... *H10F 39/8067* (2025.01); *H10F 39/18* (2025.01)

(58) Field of Classification Search
CPC ................................................ H10F 39/8067
See application file for complete search history.

(56) References Cited

U.S. PATENT DOCUMENTS 9,876,044 B2 * 1/2018 Lee ..................... H10F 39/8053
10,050,078 B2 * 8/2018 Jin ...................... H10F 39/8063
(Continued)

FOREIGN PATENT DOCUMENTS

| JP | 2013033864 A | 2/2013 | |
| JP | 2018088488 A | 6/2018 | |
| WO | WO-2018101033 A1 * | 6/2018 | ....... H01L 27/14623 |

OTHER PUBLICATIONS

International Search Report (PCT/ISA/210), International Application No. PCT/JP2021/025619, dated Sep. 14, 2021.

*Primary Examiner* — Yara B Green
*Assistant Examiner* — Erika H Son
(74) *Attorney, Agent, or Firm* — Michael Best & Friedrich LLP

(57) ABSTRACT

The present disclosure relates to a light reception element and an electronic device that make it possible to achieve better performance.
Provided is a SPAD element including an avalanche multiplication region provided at a junction surface between an N-type diffusion layer and a P-type diffusion layer provided on a side of a sensor substrate opposite from a light reception surface of the sensor substrate, a hole accumulation layer provided so as to surround a lateral surface and a light reception surface of a well provided in the sensor substrate, a pinning layer provided outside the hole accumulation layer, and an in-pixel trench structure provided in a pixel region, the pinning layer being formed all over an outer peripheral surface of the in-pixel trench structure. The present technology is applicable to, for example, a distance image sensor that performs time-of-flight (ToF)-based distance measurement.

20 Claims, 17 Drawing Sheets

(56) References Cited

U.S. PATENT DOCUMENTS

| | | | |
|---|---|---|---|
| 10,170,513 B2* | 1/2019 | Cazaux | H10F 39/811 |
| 10,468,543 B2* | 11/2019 | Wang | H10F 71/1212 |
| 11,302,738 B2* | 4/2022 | Cheng | H10F 39/807 |
| 2017/0170216 A1 | 6/2017 | Lee | |
| 2018/0182806 A1 | 6/2018 | Jin | |

* cited by examiner

LIGHT RECEPTION ELEMENT AND ELECTRONIC DEVICE

TECHNICAL FIELD

The present disclosure relates to a light reception element and an electronic device, and more particularly to a light reception element and an electronic device that make it possible to achieve better performance.

BACKGROUND ART

A distance image sensor that performs time-of-flight (ToF)-based distance measurement has recently attracted attention. For example, a pixel array in which a plurality of single photon avalanche diode (SPAD) pixels is two-dimensionally arranged using a complementary metal oxide semiconductor (CMOS) integrated circuit technology can be used as the distance image sensor. In such a SPAD pixel, when one photon enters a PN junction region of a high electric field with a voltage much larger than a breakdown voltage applied, avalanche amplification occurs. It is possible to measure a distance with high accuracy by detecting a time when a current flows instantaneously due to the occurrence of avalanche amplification.

For example, Patent Document 1 discloses a SPAD pixel having a structure that allows an enhancement in characteristics of the SPAD pixel by providing metal wiring that reflects light transmitted through a SPAD element.

CITATION LIST

Patent Document

Patent Document 1: Japanese Patent Application Laid-Open No. 2018-88488

SUMMARY OF THE INVENTION

Problems to be Solved by the Invention

In the meantime, a known SPAD pixel is enhanced in characteristics as disclosed in Patent Document 1, but it has been pointed out that hole current resistance is high and a quantum efficiency Qe is not sufficient, and it is therefore required to achieve better performance.

The present disclosure has been made in view of such circumstances, and it is therefore an object of the present disclosure to achieve better performance.

Solutions to Problems

A light reception element according to one aspect of the present disclosure includes an avalanche multiplication region provided at a junction surface between an N-type diffusion layer and a P-type diffusion layer, the N-type diffusion layer and the P-type diffusion layer being provided on a side of a sensor substrate opposite from a light reception surface of the sensor substrate, a hole accumulation layer provided so as to surround a lateral surface and a light reception surface of a well provided in the sensor substrate, a pinning layer provided outside the hole accumulation layer, and an in-pixel trench structure provided in a pixel region, the pinning layer being formed all over an outer peripheral surface of the in-pixel trench structure.

An electronic device according to one aspect of the present disclosure includes a sensor chip having light reception elements arranged in an array, each of the light reception elements including an avalanche multiplication region provided at a junction surface between an N-type diffusion layer and a P-type diffusion layer, the N-type diffusion layer and the P-type diffusion layer being provided on a side of a sensor substrate opposite from a light reception surface of the sensor substrate, a hole accumulation layer provided so as to surround a lateral surface and a light reception surface of a well provided in the sensor substrate, a pinning layer provided outside the hole accumulation layer, and an in-pixel trench structure provided in a pixel region, the pinning layer being formed all over an outer peripheral surface of the in-pixel trench structure.

In one aspect of the present disclosure, the avalanche multiplication region is provided at the junction surface between the N-type diffusion layer and the P-type diffusion layer, the N-type diffusion layer and the P-type diffusion layer being provided on the side of the sensor substrate opposite from the light reception surface of the sensor substrate, the hole accumulation layer is provided so as to surround the lateral surface and the light reception surface of the well provided in the sensor substrate, and the pinning layer is provided outside the hole accumulation layer. Then, the in-pixel trench structure is provided in the pixel region, and the pinning layer is formed all over the outer peripheral surface of the in-pixel trench structure.

MODE FOR CARRYING OUT THE INVENTION

Hereinafter, specific embodiments to which the present technology is applied will be described in detail with reference to the drawings.

<First Configuration Example of SPAD Pixel>

Figure 1:
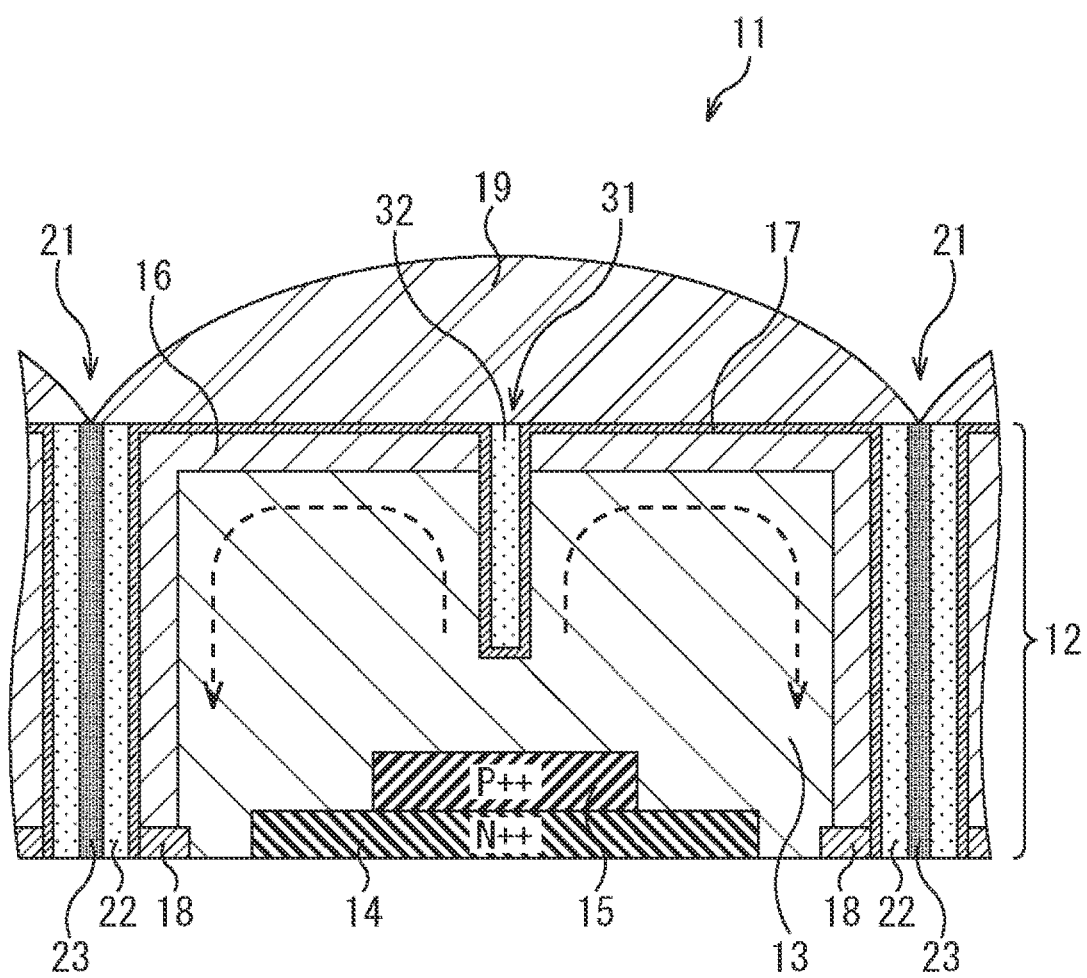
FIG. 1 is a cross-sectional view illustrating a first configuration example of a SPAD pixel, the SPAD pixel corresponding to a light reception element to which the present technology is applied.

FIG. 1 is a cross-sectional view illustrating a first configuration example of a SPAD pixel, the SPAD pixel corresponding to a light reception element to which the present technology is applied.

SPAD pixels 11 are provided in an array in a sensor substrate 12, and have a structure where the SPAD pixels 11 adjacent to each other are electrically and optically separated from each other by an inter-pixel separation part 21 as illustrated in the drawing. The inter-pixel separation part 21 includes an insulator 22 and a light shield 23 embedded in a trench extending through the sensor substrate 12, the insulator 22 containing oxide having an insulating property such as silicon dioxide, the light shield 23 containing metal having a light shielding property such as tungsten or aluminum.

Each SPAD pixel 11 includes an N-well 13, an N-type diffusion layer 14, a P-type diffusion layer 15, a hole accumulation layer 16, a pinning layer 17, and a high-concentration P-type diffusion layer 18 provided in the sensor substrate 12. Furthermore, for each SPAD pixel 11, an on-chip microlens 19 that concentrates light is placed onto a light reception surface serving as a back surface of the sensor substrate 12. Moreover, the SPAD pixel 11 has a configuration where an in-pixel trench structure 31 is provided in a pixel region other than the inter-pixel separation part 21 provided at a pixel end.

For example, in the SPAD pixel 11, an avalanche multiplication region is formed in a depletion layer formed in a region where the N-type diffusion layer 14 and the P-type diffusion layer 15 are contiguous to each other. For example, in the avalanche multiplication region, supplying a large negative voltage to the P-type diffusion layer 15 makes it possible to avalanche-multiply electrons generated from an incoming single photon. Then, when a voltage generated by the avalanche-multiplied electrons reaches a negative voltage, the avalanche-multiplied electrons are emitted to cause quenting that causes a return to an initial voltage, the voltage generated by the avalanche-multiplied electrons is shaped, and a light reception signal (APD OUT) involving the generation of a pulse waveform starting from an arrival time of the single photon is output.

The N-well 13 is formed by controlling an impurity concentration of the sensor substrate 12 to a n-type, and forms an electric field that transfers electrons generated by photoelectric conversion in the SPAD pixel 11 to the avalanche multiplication region provided at a junction surface between the N-type diffusion layer 14 and the P-type diffusion layer 15. Note that a P-well may be formed instead of the N-well 13 by controlling the impurity concentration of the sensor substrate 12 to a p-type, and in this case, the n-type and the p-type are interchanged in the following description.

The N-type diffusion layer 14 is a high-concentration N-type diffusion layer (N++), and the P-type diffusion layer 15 is a high-concentration P-type diffusion layer (P++). The N-type diffusion layer 14 and the P-type diffusion layer 15 are formed so as to be in contact with each other almost all over the SPAD pixel 11 in the vicinity of a front surface (lower side in FIG. 1) of the sensor substrate 12 opposite from the light reception surface.

The hole accumulation layer 16 is a P-type diffusion layer (P) formed so as to surround a lateral surface and back surface (light reception surface) of the N-well 13, and accumulates holes. Furthermore, the hole accumulation layer 16 is electrically connected to an anode of the SPAD pixel 11 and allows bias adjustment. This increases a hole concentration of the hole accumulation layer 16 and strengthens pinning including the pinning layer 17, so that it is possible to suppress generation of dark current, for example.

The pinning layer 17 is a high-concentration P-type diffusion layer (P+) formed on a surface (the back surface of the sensor substrate 12, a lateral surface of the sensor substrate 12 in contact with the insulator 22, and the entirety of an outer peripheral surface of an insulator 32) outside the hole accumulation layer 16, and suppresses, in a similar manner to the hole accumulation layer 16, generation of dark current, for example.

The high-concentration P-type diffusion layer 18 is a high-concentration P-type diffusion layer (P++) formed so as to surround an outer peripheral surface of the N-well 13 in the vicinity of the front surface of the sensor substrate 12, and is used to electrically connect the hole accumulation layer 16 to the anode of the SPAD pixel 11.

The in-pixel trench structure 31 has a configuration where the insulator 32 similar to the insulator 22 is embedded in a trench extending from the back surface of the sensor substrate 12 to a predetermined depth, and the pinning layer 17 is formed all over an outer peripheral surface of the in-pixel trench structure 31. The SPAD pixel 11 illustrated in FIG. 1 has a configuration where one in-pixel trench structure 31 is provided at the center of the pixel region.

For example, in a case where the in-pixel trench structure 31 is formed in a region where the P-type diffusion layer 15 is disposed as viewed from above so as not to be equal in potential to the hole accumulation layer 16 on a periphery the SPAD pixel 11, the in-pixel trench structure 31 is provided extending up to a depth where the in-pixel trench structure 31 does not come into with the P-type diffusion layer 15. Furthermore, in order to maintain sensitivity of the SPAD pixel 11, it is preferable that the in-pixel trench structure 31 be formed with a width less than or equal to a predetermined width, specifically, less than a width of the inter-pixel separation part 21.

In the SPAD pixel 11 configured as described above, providing the pinning layer 17 all over the outer peripheral surface of the in-pixel trench structure 31 disposed at the center of the pixel region forms a path (path represented by a dashed line in FIG. 1) that allows a hole current to flow easily. Then, filling the hole accumulation layer 16 on the periphery of the SPAD pixel 11 with holes allows a reduction in hole current resistance.

Moreover, in the SPAD pixel 11, the presence of the in-pixel trench structure 31 allows an increase in optical path length (described later with reference to FIG. 2) and an increase in quantum efficiency Qe.

Therefore, as compared with a known structure, the SPAD pixel 11 provided with the in-pixel trench structure 31 can reduce the hole current resistance and increase the quantum efficiency Qe, thereby making it possible to achieve better performance.

<Second Configuration Example of SPAD Pixel>

A second configuration example of the SPAD pixel will be described with reference to FIG. 2.

Figure 2:
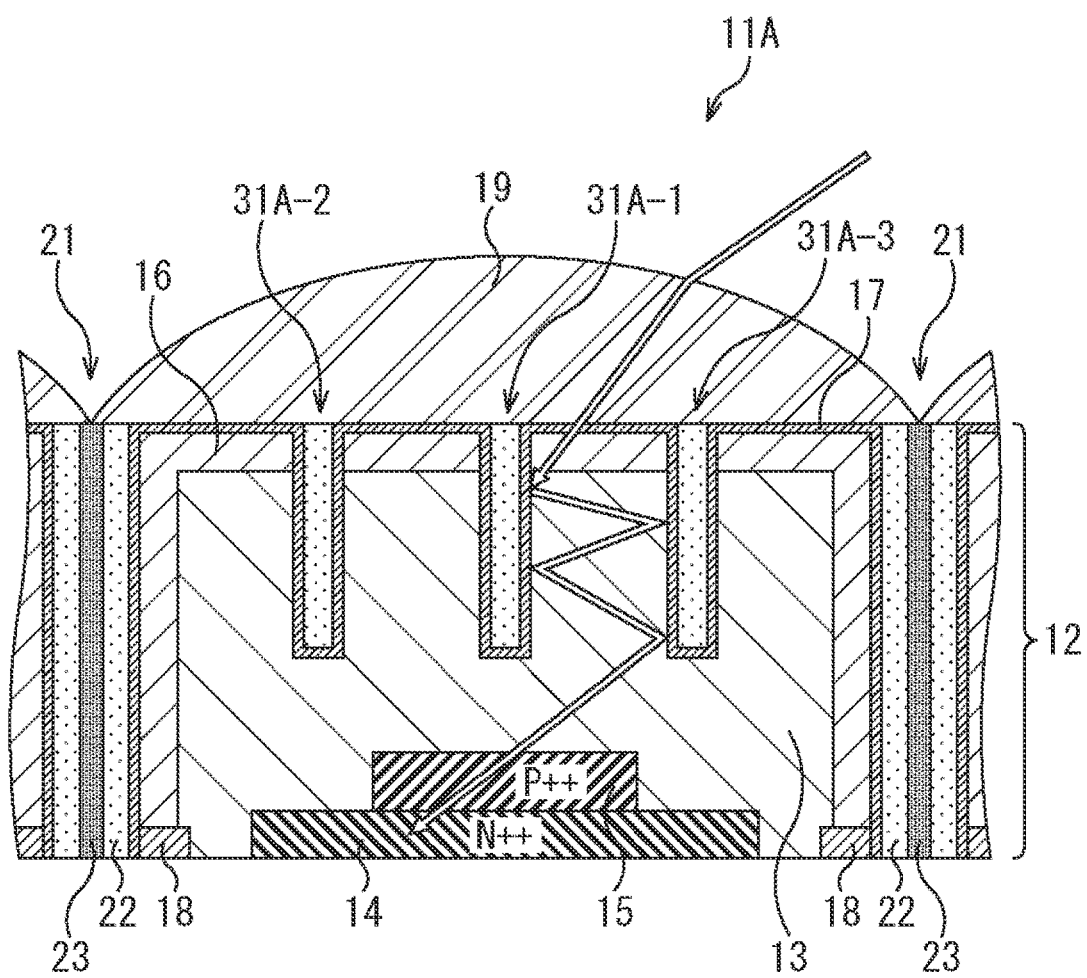
FIG. 2 is a cross-sectional view illustrating a second configuration example of the SPAD pixel.

FIG. 2 illustrates a cross-sectional configuration of a SPAD pixel 11A. Note that components common to the SPAD pixel 11A illustrated in FIG. 2 and the SPAD pixel 11 in FIG. 1 are denoted by the same reference numerals, and no detailed description will be given below of such components.

That is, the SPAD pixel 11A is the same in configuration as the SPAD pixel 11 in FIG. 1 in that the N-well 13, the N-type diffusion layer 14, the P-type diffusion layer 15, the hole accumulation layer 16, the pinning layer 17, and the high-concentration P-type diffusion layer 18 are provided in the sensor substrate 12. Furthermore, the SPAD pixel 11A has the on-chip microlens 19 placed on the light reception surface of the sensor substrate 12, and the SPAD pixels 11A adjacent to each other are separated by the inter-pixel separation part 21, in a similar manner to the SPAD pixel 11 in FIG. 1.

Then, the SPAD pixel 11A is different in configuration from the SPAD pixel 11 in FIG. 1 in that a plurality of in-pixel trench structures 31A is provided in the pixel region. In the example illustrated in FIG. 2, the SPAD pixel 11A has a configuration where three in-pixel trench structures 31A-1 to 31A-3 are provided. Note that the in-pixel trench structures 31A-1 to 31A-3 each has a configuration where the insulator 32 (see FIG. 1) is embedded in a trench extending from the back surface of the sensor substrate 12, and the pinning layer 17 is formed all over an outer peripheral surface of each of the in-pixel trench structures 31A-1 to 31A-3.

As described above, the SPAD pixel 11A provided with the plurality of in-pixel trench structures 31A causes incident light as indicated by a hollow arrow to reflect between the plurality of in-pixel trench structures 31A, so as to allow an increase in optical path length. As described above, it is possible to increase the quantum efficiency Qe by increasing the optical path length of light incident on the SPAD pixel 11A.

Furthermore, the SPAD pixel 11A provided with the pinning layer 17 all over the outer peripheral surfaces of the plurality of in-pixel trench structures 31A can also reduce the hole current resistance in a similar manner to the SPAD pixel 11 in FIG. 1.

Therefore, the SPAD pixel 11A provided with the plurality of in-pixel trench structures 31A can reduce the hole current resistance and increase the quantum efficiency Qe, thereby making it possible to achieve better performance.

<Third Configuration Example of SPAD Pixel>

A third configuration example of the SPAD pixel will be described with reference to FIG. 3.

Figure 3:
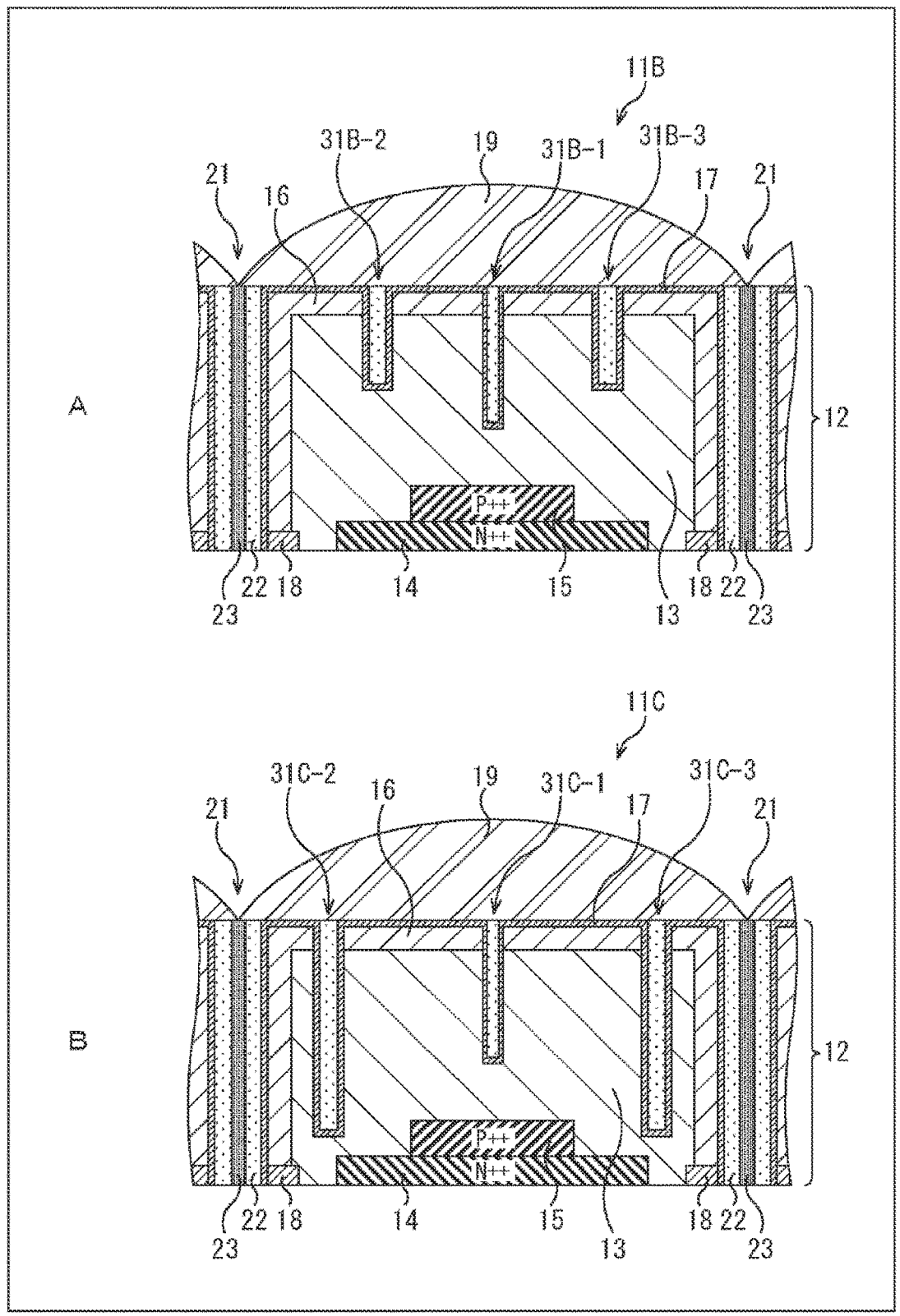
FIG. 3 is a cross-sectional view illustrating a third configuration example of the SPAD pixel.

A of FIG. 3 illustrates a first variation of the third configuration example of the SPAD pixel, and B of FIG. 3 illustrates a second variation of the third configuration example of the SPAD pixel. Note that components common to a SPAD pixel 11B illustrated in A of FIG. 3, a SPAD pixel 11C illustrated in B of FIG. 3, and the SPAD pixel 11 in FIG. 1 are denoted by the same reference numerals, and no detailed description will be given below of such components.

That is, the SPAD pixels 11B and 11C are the same in configuration as the SPAD pixel 11 in FIG. 1 in that the N-well 13, the N-type diffusion layer 14, the P-type diffusion layer 15, the hole accumulation layer 16, the pinning layer 17, and the high-concentration P-type diffusion layer 18 are provided in the sensor substrate 12. Furthermore, the SPAD pixels 11B and 11C each have the on-chip microlens 19 placed on the light reception surface of the sensor substrate 12, and the SPAD pixels 11B adjacent to each other and the SPAD pixels 11C adjacent to each other are separated by the inter-pixel separation part 21, in a similar manner to the SPAD pixel 11 in FIG. 1.

Then, the SPAD pixels 11B and 11C are different in configuration from the SPAD pixel 11 in FIG. 1 in that a plurality of in-pixel trench structures 31B and 31C is provided in the pixel region and each has a unique depth and width. Note that the in-pixel trench structures 31B and 31C each have a configuration where the insulator 32 (see FIG. 1) is embedded in a trench extending from the back surface of the sensor substrate 12, and the pinning layer 17 is formed all over an outer peripheral surface of each of the in-pixel trench structures 31B and 31C.

As illustrated in A of FIG. 3, in the SPAD pixel 11B, an in-pixel trench structure 31B-1 disposed at the center is deeper and narrower than in-pixel trench structures 31B-2 and 31B-3 each disposed at a corresponding outer side. That is, the in-pixel trench structures 31B-2 and 31B-3 are shallower and wider than the in-pixel trench structure 31B-1.

As illustrated in B of FIG. 3, in the SPAD pixel 11C, an in-pixel trench structure 31C-1 disposed at the center is shallower and narrower than in-pixel trench structures 31C-2 and 31C-3 each disposed at a corresponding outer side. That is, the in-pixel trench structures 31C-2 and 31C-3 are deeper and wider than the in-pixel trench structure 31C-1.

The SPAD pixels 11B and 11C configured as described above and provided with the in-pixel trench structures 31B and 31C can also increase the quantum efficiency Qe and reduce the hole current resistance in a similar manner to the SPAD pixel 11 in FIG. 1. As a result, the SPAD pixels 11B and 11C can achieve better performance.

<Fourth Configuration Example of SPAD Pixel>

A fourth configuration example of the SPAD pixel will be described with reference to FIG. 4.

Figure 4:
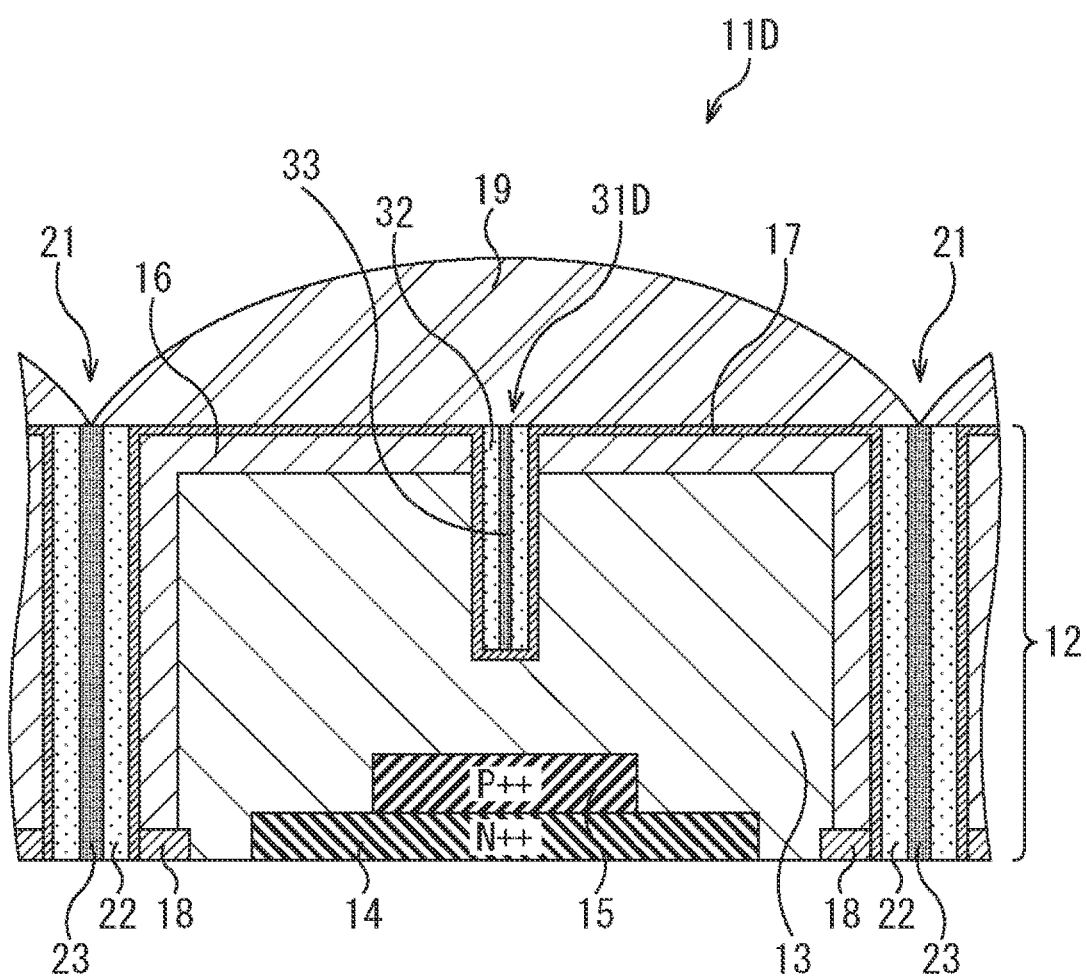
FIG. 4 is a cross-sectional view illustrating a fourth configuration example of the SPAD pixel.

FIG. 4 illustrates a cross-sectional configuration of a SPAD pixel 11D. Note that components common to the SPAD pixel 11D illustrated in FIG. 4 and the SPAD pixel 11 in FIG. 1 are denoted by the same reference numerals, and no detailed description will be given below of such components.

That is, the SPAD pixel 11D is the same in configuration as the SPAD pixel 11 in FIG. 1 in that the N-well 13, the N-type diffusion layer 14, the P-type diffusion layer 15, the hole accumulation layer 16, the pinning layer 17, and the high-concentration P-type diffusion layer 18 are provided in the sensor substrate 12. Furthermore, the SPAD pixel 11D has the on-chip microlens 19 placed on the light reception surface of the sensor substrate 12, and the SPAD pixels 11D adjacent to each other are separated by the inter-pixel separation part 21, in a similar manner to the SPAD pixel 11 in FIG. 1.

Then, the SPAD pixel 11D is different in configuration from the SPAD pixel 11 in FIG. 1 in that a light shield 33 containing metal having a light shielding property such as tungsten or aluminum is provided in an in-pixel trench structure 31D. That is, the in-pixel trench structure 31D has a configuration where the insulator 32 is embedded in a trench extending from the back surface of the sensor substrate 12, and the light shield 33 is embedded between the insulators 32, in a similar manner to the inter-pixel separation part 21. Furthermore, the pinning layer 17 is provided all over an outer peripheral surface of the in-pixel trench structure 31D.

As described above, the SPAD pixel 11D provided with the in-pixel trench structure 31D similar in configuration to the inter-pixel separation part 21 can increase the quantum efficiency Qe and reduce the hole current resistance in a similar manner to the SPAD pixel 11 in FIG. 1. As a result, the SPAD pixel 11D can achieve better performance.

<Fifth Configuration Example of SPAD Pixel>

A fifth configuration example of the SPAD pixel will be described with reference to FIG. 5.

Figure 5:
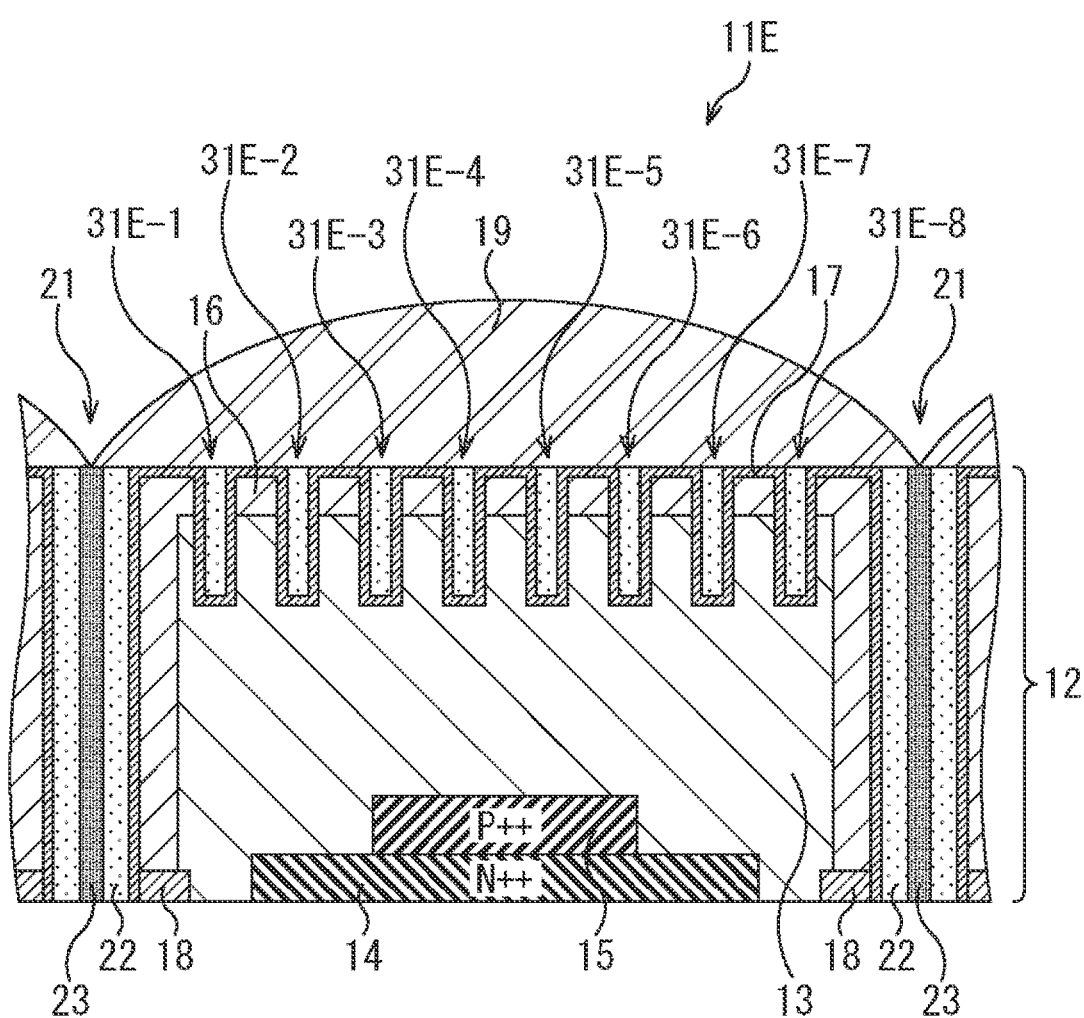
FIG. 5 is a cross-sectional view illustrating a fifth configuration example of the SPAD pixel.

FIG. 5 illustrates a cross-sectional configuration of a SPAD pixel 11E. Note that components common to the SPAD pixel 11E illustrated in FIG. 5 and the SPAD pixel 11 in FIG. 1 are denoted by the same reference numerals, and no detailed description will be given below of such components.

That is, the SPAD pixel 11E is the same in configuration as the SPAD pixel 11 in FIG. 1 in that the N-well 13, the N-type diffusion layer 14, the P-type diffusion layer 15, the hole accumulation layer 16, the pinning layer 17, and the high-concentration P-type diffusion layer 18 are provided in the sensor substrate 12. Furthermore, the SPAD pixel 11E has the on-chip microlens 19 placed on the light reception surface of the sensor substrate 12, and the SPAD pixels 11E adjacent to each other are separated by the inter-pixel separation part 21, in a similar manner to the SPAD pixel 11 in FIG. 1.

Then, the SPAD pixel 11E is different in configuration from the SPAD pixel 11 in FIG. 1 in that multiple (for example, three or more as illustrated in FIG. 2) in-pixel trench structures 31E are provided in the pixel region. In the example illustrated in FIG. 5, the SPAD pixel 11E has a configuration where eight in-pixel trench structures 31E-1 to 31E-8 are provided. Note that the in-pixel trench structures 31E-1 to 31E-8 each have a configuration where the insulator 32 (see FIG. 1) is embedded in a trench extending from the back surface of the sensor substrate 12, and the pinning layer 17 is formed all over an outer peripheral surface of each of the in-pixel trench structures 31E-1 to 31E-8.

As described above, the SPAD pixel 11E provided with the multiple in-pixel trench structures 31E can increase the quantum efficiency Qe and reduce the hole current resistance in a similar manner to the SPAD pixel 11 in FIG. 1. As a result, the SPAD pixel 11E can achieve better performance.

Note that the multiple in-pixel trench structures 31E are arranged at equal intervals in the SPAD pixel 11E illustrated in FIG. 5, or alternatively, may be arranged at unequal intervals.

Figure 6:
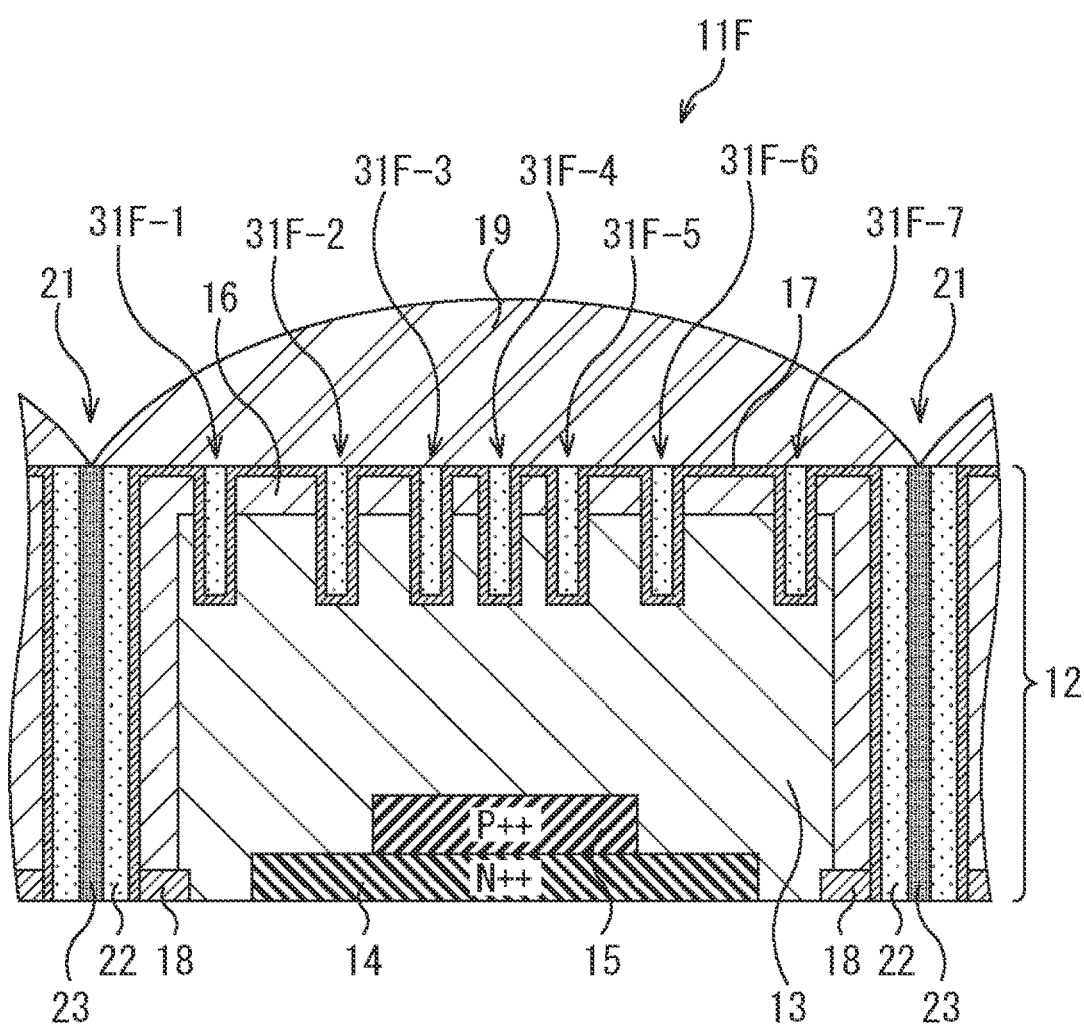
FIG. 6 is a cross-sectional view illustrating a modification of the fifth configuration example of the SPAD pixel.

FIG. 6 illustrates a modification of the fifth configuration example of the SPAD pixel.

A SPAD pixel 11F illustrated in FIG. 6 is provided with seven in-pixel trench structures 31F-1 to 31F-7, and the seven in-pixel trench structures 31F-1 to 31F-7 are arranged at intervals so as to make the intervals smaller at the center and to make the intervals larger at the outer sides. Such intervals at which the in-pixel trench structures 31F-1 to 31F-7 are arranged are adjusted so as to allow photons to easily collect in the avalanche multiplication region provided at the junction surface between the N-type diffusion layer 14 and the P-type diffusion layer 15, for example. This allows the SPAD pixel 11F to detect photons more easily.

For example, reflecting a result of optical simulation in the intervals at which the in-pixel trench structures 31F are arranged and appropriately arranging the in-pixel trench structures 31F causes photons reflected off the in-pixel trench structures 31F to be guided to the avalanche multiplication region.

The SPAD pixel 11F provided with the in-pixel trench structures 31F configured as described above can not only increase the quantum efficiency Qe and reduce the hole current resistance in a similar manner to the SPAD pixel 11 in FIG. 1 but also detect photons more easily. This allows the SPAD pixel 11F to achieve better performance.

<Sixth Configuration Example of SPAD Pixel>

A sixth configuration example of the SPAD pixel will be described with reference to FIG. 7.

Figure 7:
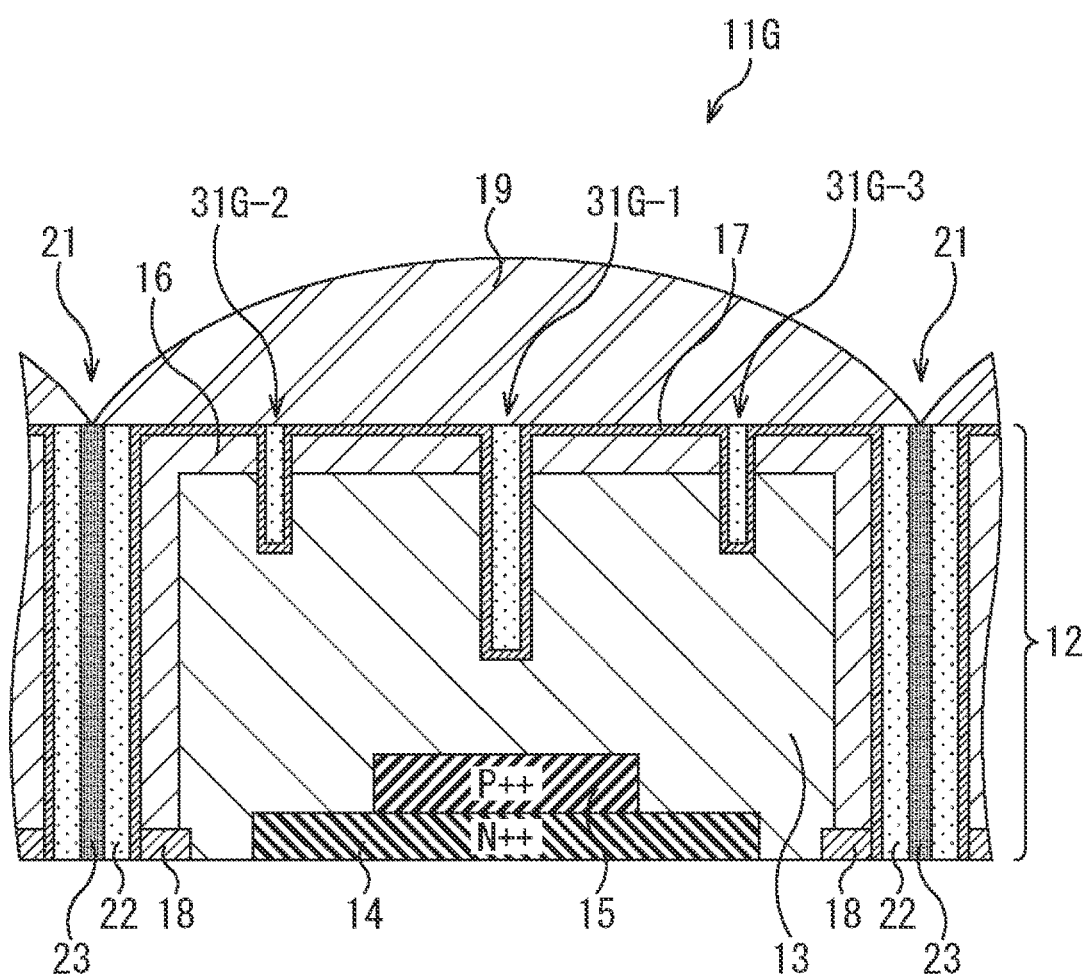
FIG. 7 is a cross-sectional view illustrating a sixth configuration example of the SPAD pixel.

FIG. 7 illustrates a cross-sectional configuration of a SPAD pixel 11G. Note that components common to the SPAD pixel 11G illustrated in FIG. 7 and the SPAD pixel 11 in FIG. 1 are denoted by the same reference numerals, and no detailed description will be given below of such components.

That is, the SPAD pixel 11G is the same in configuration as the SPAD pixel 11 in FIG. 1 in that the N-well 13, the N-type diffusion layer 14, the P-type diffusion layer 15, the hole accumulation layer 16, the pinning layer 17, and the high-concentration P-type diffusion layer 18 are provided in the sensor substrate 12. Furthermore, the SPAD pixel 11G has the on-chip microlens 19 placed on the light reception surface of the sensor substrate 12, and the SPAD pixels 11G adjacent to each other are separated by the inter-pixel separation part 21, in a similar manner to the SPAD pixel 11 in FIG. 1.

Then, the SPAD pixel 11G has a configuration where a plurality of in-pixel trench structures 31G is provided in the pixel region so as to have a depth and width applied to a manufacturing process of collectively forming a plurality of trenches. In the example illustrated in FIG. 7, the SPAD pixel 11G has a configuration where three in-pixel trench structures 31G-1 to 31G-3 are provided. Note that the in-pixel trench structures 31G-1 to 31G-3 each have a configuration where the insulator 32 (see FIG. 1) is embedded in a trench extending from the back surface of the sensor substrate 12, and the pinning layer 17 is formed all over an outer peripheral surface of each of the in-pixel trench structures 31G-1 to 31G-3.

That is, due to a manufacturing process of providing the plurality of in-pixel trench structures 31G, in a case where a plurality of trenches different in depth from each other is collectively formed, the deeper the trench, the wider the width, and the shallower the trench, the narrower the width. The SPAD pixel 11G having the in-pixel trench structures 31G each formed using the trench formed as described above suppresses an increase in the number of processes.

As illustrated in FIG. 7, in the SPAD pixel 11G, the in-pixel trench structure 31G-1 disposed at the center is deeper and wider than the in-pixel trench structures 31G-2 and 31G-3 each disposed at a corresponding outer side. That is, the in-pixel trench structures 31G-2 and 31G-3 are shallower and narrower than the in-pixel trench structure 31G-1.

The SPAD pixel 11G configured as described above and provided with the in-pixel trench structures 31G can also increase the quantum efficiency Qe and reduce the hole current resistance in a similar manner to the SPAD pixel 11 in FIG. 1. As a result, the SPAD pixel 11G can achieve better performance and avoid an increase in the number of processes.

Figure 8:
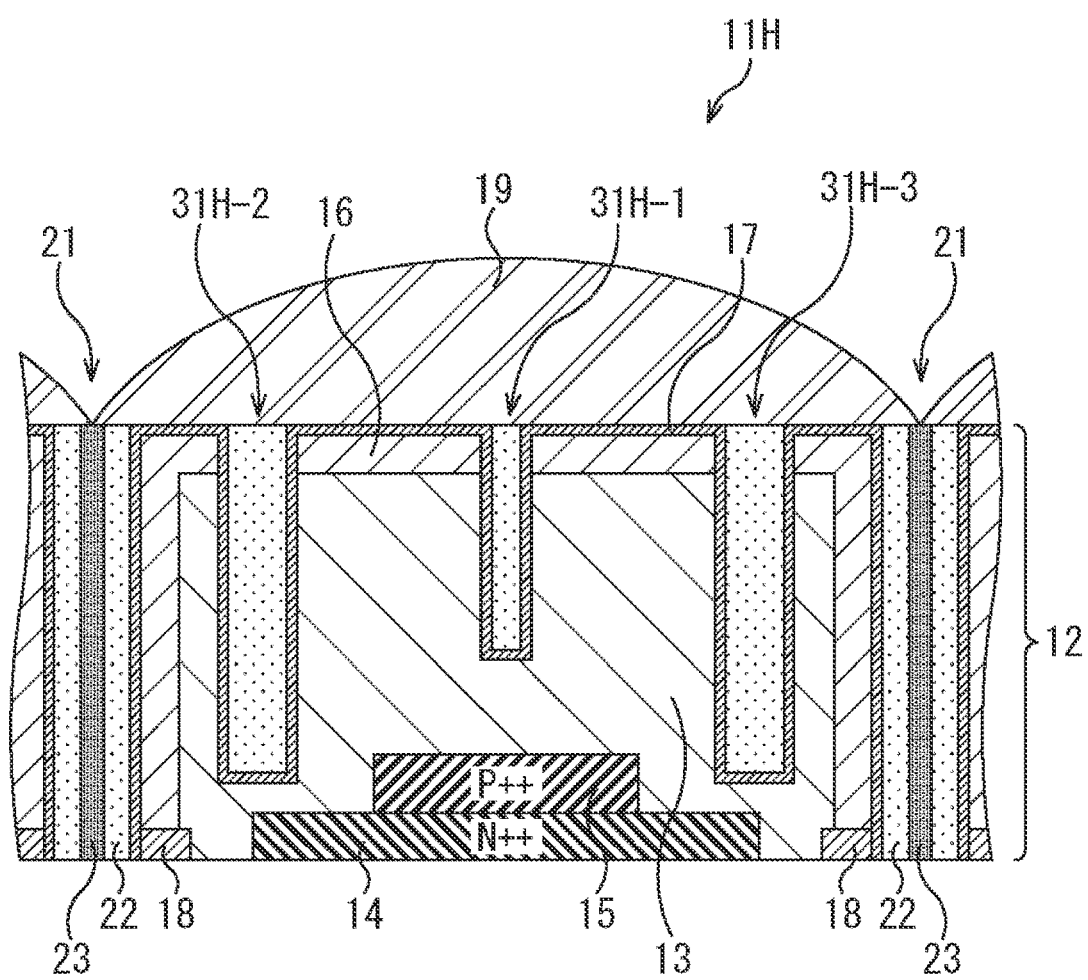
FIG. 8 is a cross-sectional view illustrating a modification of the sixth configuration example of the SPAD pixel.

FIG. 8 illustrates a modification of the sixth configuration example of the SPAD pixel.

As illustrated in FIG. 8, in a SPAD pixel 11H, an in-pixel trench structure 31H-1 disposed at the center is shallower and narrower than in-pixel trench structures 31H-2 and 31H-3 each disposed at a corresponding outer side. That is, the in-pixel trench structures 31H-2 and 31H-3 are deeper and wider than the in-pixel trench structure 31B-1.

The SPAD pixel 11H configured as described above can also achieve better performance and avoid an increase in the number of processes in a similar manner to the SPAD pixel 11G in FIG. 7.

<Seventh Configuration Example of SPAD Pixel>

A seventh configuration example of the SPAD pixel will be described with reference to FIG. 9.

Figure 9:
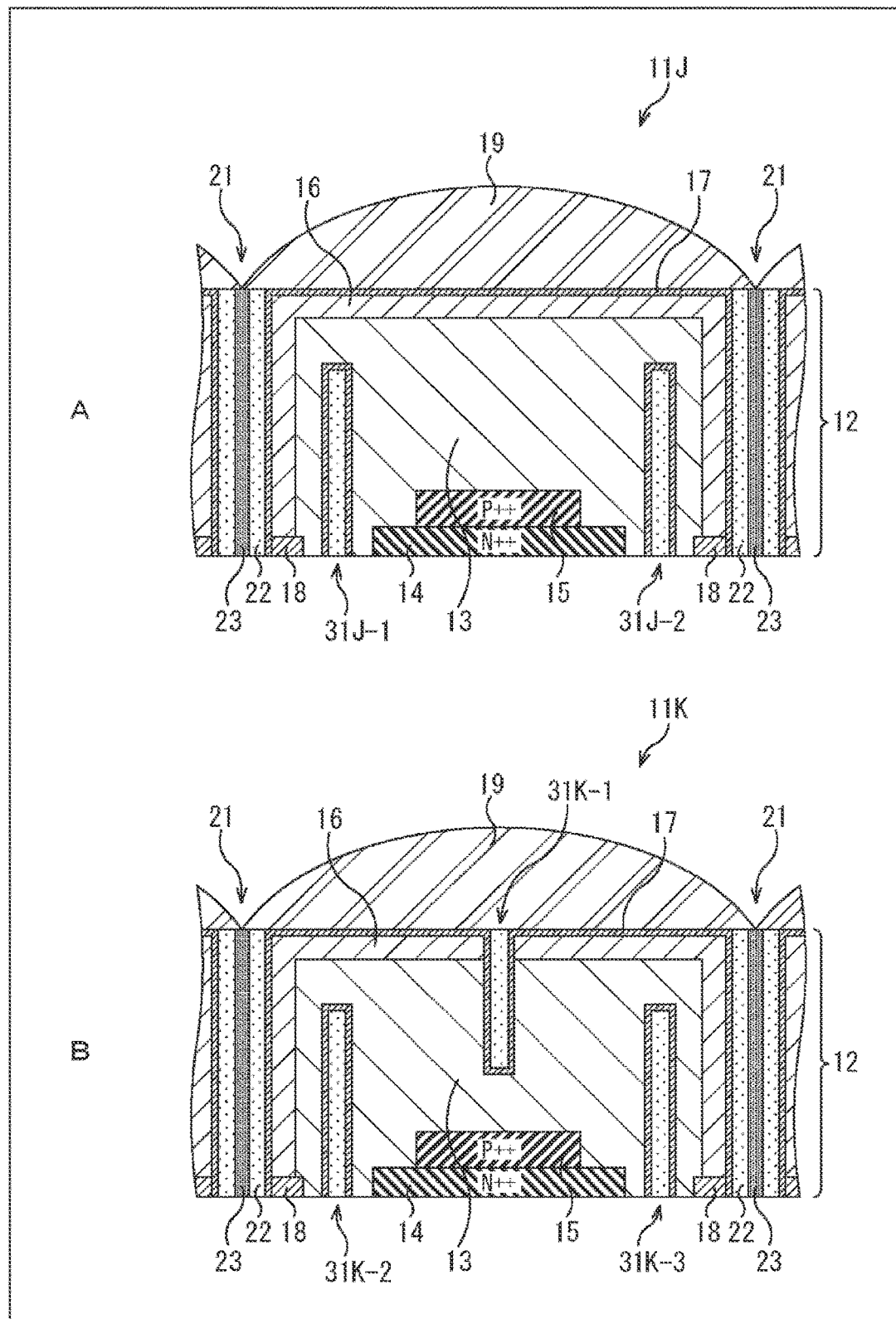
FIG. 9 is a cross-sectional view illustrating a seventh configuration example of the SPAD pixel.

A of FIG. 9 illustrates a first variation of the seventh configuration example of the SPAD pixel, and B of FIG. 9 illustrates a second variation of the seventh configuration example of the SPAD pixel. Note that components common to a SPAD pixel 11J illustrated in A of FIG. 9, a SPAD pixel 11K illustrated in B of FIG. 9, and the SPAD pixel 11 in FIG. 1 are denoted by the same reference numerals, and no detailed description will be given below of such components.

That is, the SPAD pixels 11J and 11K are the same in configuration as the SPAD pixel 11 in FIG. 1 in that the N-well 13, the N-type diffusion layer 14, the P-type diffusion layer 15, the hole accumulation layer 16, the pinning layer 17, and the high-concentration P-type diffusion layer 18 are provided in the sensor substrate 12. Furthermore, the SPAD pixels 11J and 11K each have the on-chip microlens 19 placed on the light reception surface of the sensor substrate 12, and the SPAD pixels 11J adjacent to each other and the SPAD pixels 11K adjacent to each other are separated by the inter-pixel separation part 21, in a similar manner to the SPAD pixel 11 in FIG. 1.

Then, the SPAD pixels 11J and 11K are different in configuration from the SPAD pixel 11 in FIG. 1 in that in-pixel trench structures 31J and 31K are further provided extending from the front surface (lower surface in FIG. 9) of the sensor substrate 12.

As illustrated in A of FIG. 9, the SPAD pixel 11J includes the in-pixel trench structures 31J and 31K each having a configuration where the insulator 32 (see FIG. 1) is embedded in a trench extending from the front surface of the sensor substrate 12, and the pinning layer 17 formed all over an outer peripheral surface of each of the in-pixel trench structures 31J and 31K.

As illustrated in B of FIG. 9, the SPAD pixel 11 K includes a combination of an in-pixel trench structure 31K-1 formed extending from the back surface of the sensor substrate 12 and in-pixel trench structures 31K-2 and 31K-2 formed extending from the front surface of the sensor substrate 12.

The SPAD pixels 11J and 11K configured as described above and provided with the in-pixel trench structures 31J and 31K can also increase the quantum efficiency Qe and reduce the hole current resistance in a similar manner to the SPAD pixel 11 in FIG. 1. As a result, the SPAD pixels 11J and 11K can achieve better performance.

<Eighth Configuration Example of SPAD Pixel>

An eighth configuration example of the SPAD pixel will be described with reference to FIG. 10.

Figure 10:
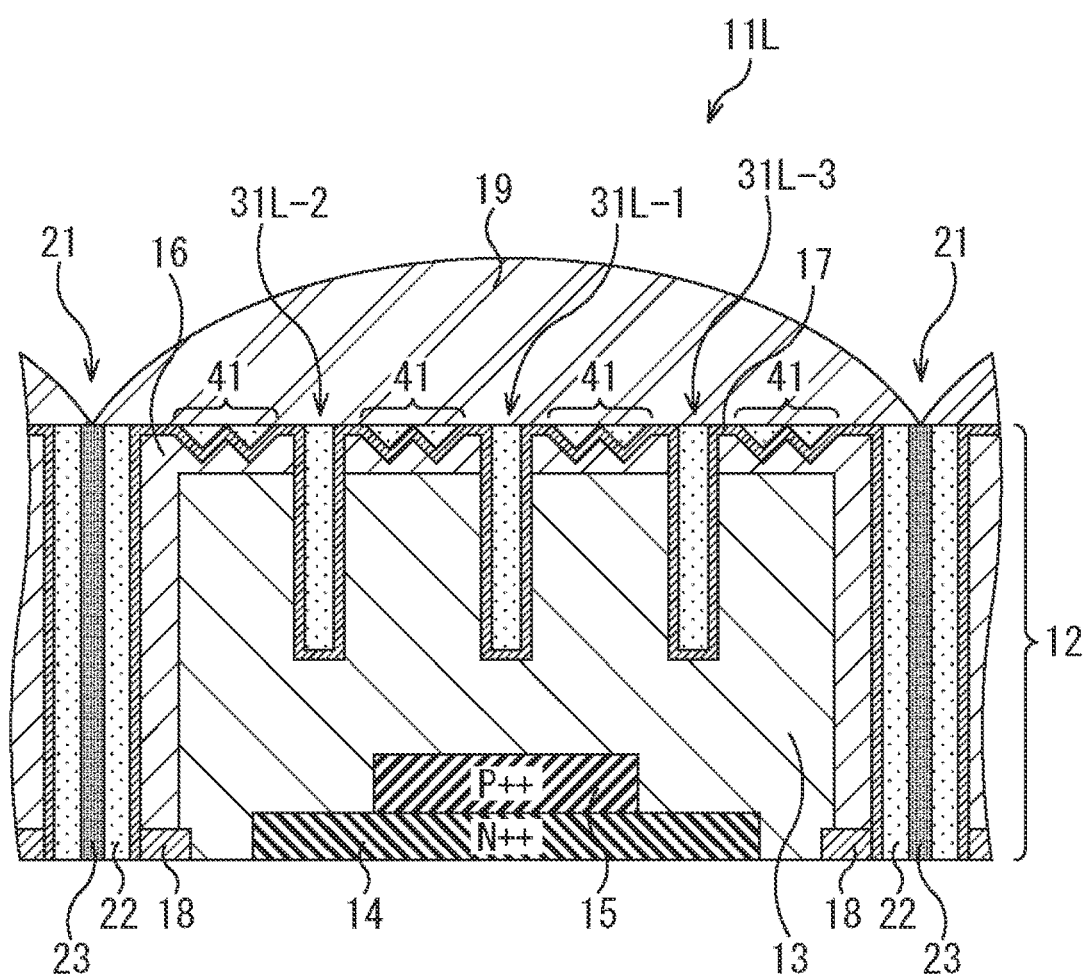
FIG. 10 is a cross-sectional view illustrating an eighth configuration example of the SPAD pixel.

FIG. 10 illustrates a cross-sectional configuration of a SPAD pixel 11L. Note that components common to the SPAD pixel 11L illustrated in FIG. 10 and the SPAD pixel 11 in FIG. 1 are denoted by the same reference numerals, and no detailed description will be given below of such components.

That is, the SPAD pixel 11L is the same in configuration as the SPAD pixel 11 in FIG. 1 in that the N-well 13, the N-type diffusion layer 14, the P-type diffusion layer 15, the hole accumulation layer 16, the pinning layer 17, and the high-concentration P-type diffusion layer 18 are provided in the sensor substrate 12. Furthermore, the SPAD pixel 11L has the on-chip microlens 19 placed on the light reception surface of the sensor substrate 12, and the SPAD pixels 11L adjacent to each other are separated by the inter-pixel separation part 21, in a similar manner to the SPAD pixel 11 in FIG. 1.

Then, the SPAD pixel 11L is different in configuration from the SPAD pixel 11 in FIG. 1 in that a plurality of in-pixel trench structures 31L is provided in the pixel region, and a moth-eye structure 41 is provided on the back surface (light reception surface) of the sensor substrate 12 between the in-pixel trench structures 31L. Note that the in-pixel trench structures 31L each have a configuration where the insulator 32 (see FIG. 1) is embedded in a trench extending from the back surface of the sensor substrate 12, and the pinning layer 17 is formed all over an outer peripheral surface of each of the in-pixel trench structures 31L.

That is, the SPAD pixel 11L can suppress, by the moth-eye structure 41, reflection of light off the front surface of the sensor substrate 12 and increase the optical path length by diffusing light that has impinged on the sensor substrate 12. Moreover, the SPAD pixel 11L provided with the in-pixel trench structures 31L can also increase the quantum efficiency Qe and reduce the hole current resistance in a similar manner to the SPAD pixel 11 in FIG. 1. As a result, the SPAD pixel 11L can achieve better performance.

Note that the SPAD pixel 11 L illustrated in FIG. 10 has a configuration corresponding to a combination of the moth-eye structure 41 and the above-described SPAD pixel 11A in FIG. 2, but may have a configuration corresponding to a combination of the moth-eye structure 41 and each of the SPAD pixels 11B to 11K other than the SPAD pixel 11A.

<Variation of In-Pixel Trench Structure>

Variations of a planar layout of the in-pixel trench structure 31 will be described with reference to FIG. 11.

Figure 11:
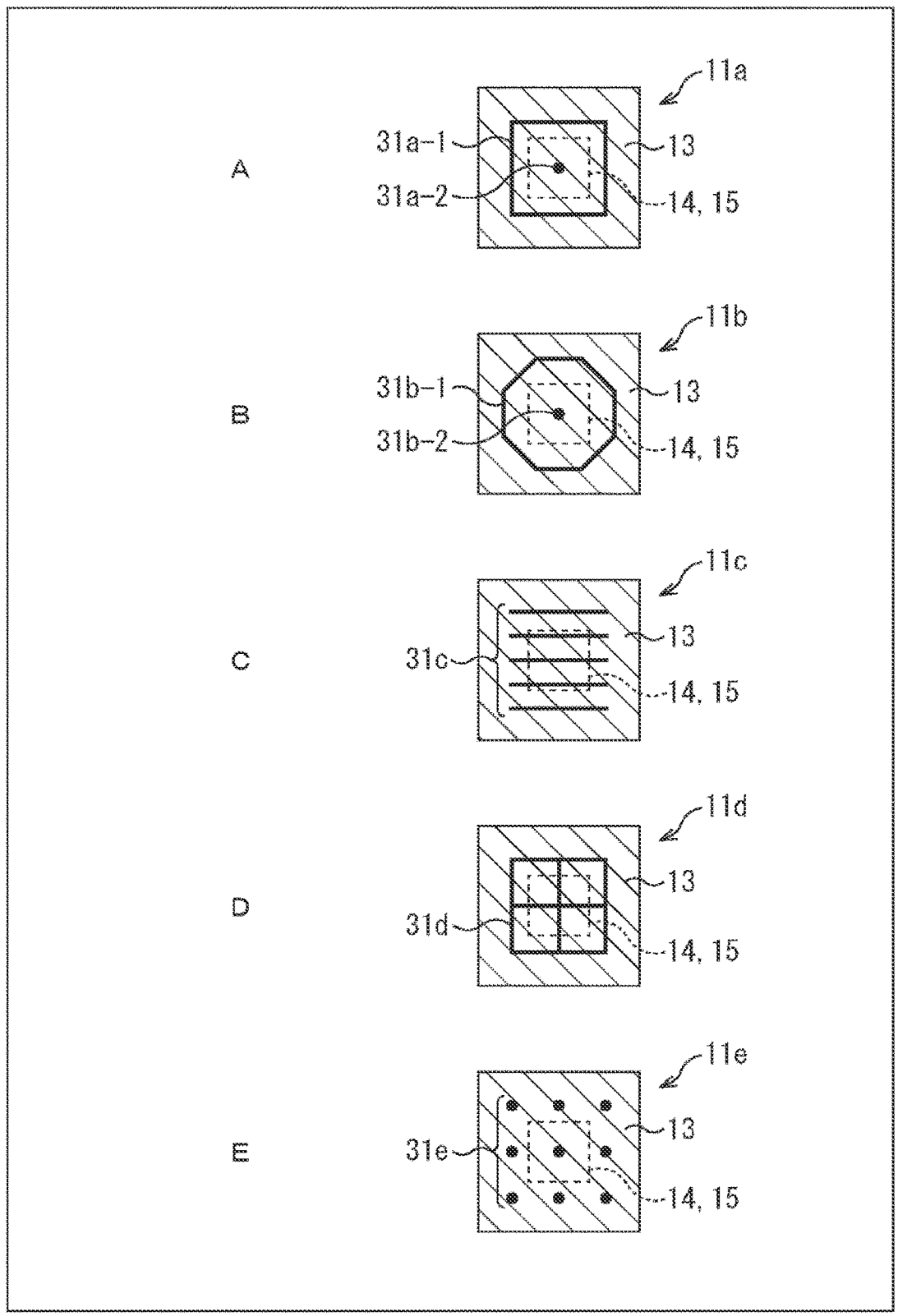
FIG. 11 is a diagram illustrating variations of an in-pixel trench structure.

A SPAD pixel 11a illustrated in A of FIG. 11 is provided with an in-pixel trench structure 31a-1 having a rectangular shape surrounding the N-type diffusion layer 14 and the P-type diffusion layer 15, and an in-pixel trench structure 31a-2 having a dot shape at the center of the SPAD pixel 11a as viewed from above.

A SPAD pixel 11b illustrated in B of FIG. 11 is provided with an in-pixel trench structure 31b-1 having a polygonal shape (octagon in the illustrated example) surrounding the N-type diffusion layer 14 and the P-type diffusion layer 15 and an in-pixel trench structure 31b-2 having a dot shape at the center of the SPAD pixel 11a as viewed from above.

A SPAD pixel 11c illustrated in C of FIG. 11 is provided with a plurality of (five in the illustrated example) in-pixel trench structures 31c arranged in a longitudinal direction, each in-pixel trench structure 31c extending in a lateral direction, as viewed from above.

A SPAD pixel 11d illustrated in D of FIG. 11 is provided with an in-pixel trench structure 31d having a combination of a rectangular shape surrounding the N-type diffusion layer 14 and the P-type diffusion layer 15 and a cross shape disposed in the rectangular shape (so-called cross-in-square shape) as viewed from above.

The SPAD pixel 11d illustrated in E of FIG. 11 is provided with a plurality of in-pixel trench structures 31e each having a dot shape and arranged regularly (nine in-pixel trench structures 31e are arranged in a 3 by 3 matrix in the illustrated example).

Note that, in addition to the structures as illustrated in FIG. 11, for example, an in-pixel trench structure 31 having a shape surrounding the N-type diffusion layer 14 and the P-type diffusion layer 15 doubly, triply, or more may be provided. As described above, providing the in-pixel trench structure 31 having a shape surrounding the N-type diffusion layer 14 and the P-type diffusion layer 15 makes it possible to efficiently concentrate photons into the avalanche multiplication region.

<Ninth Configuration Example of SPAD Pixel>

A ninth configuration example of the SPAD pixel will be described with reference to FIG. 12.

Figure 12:
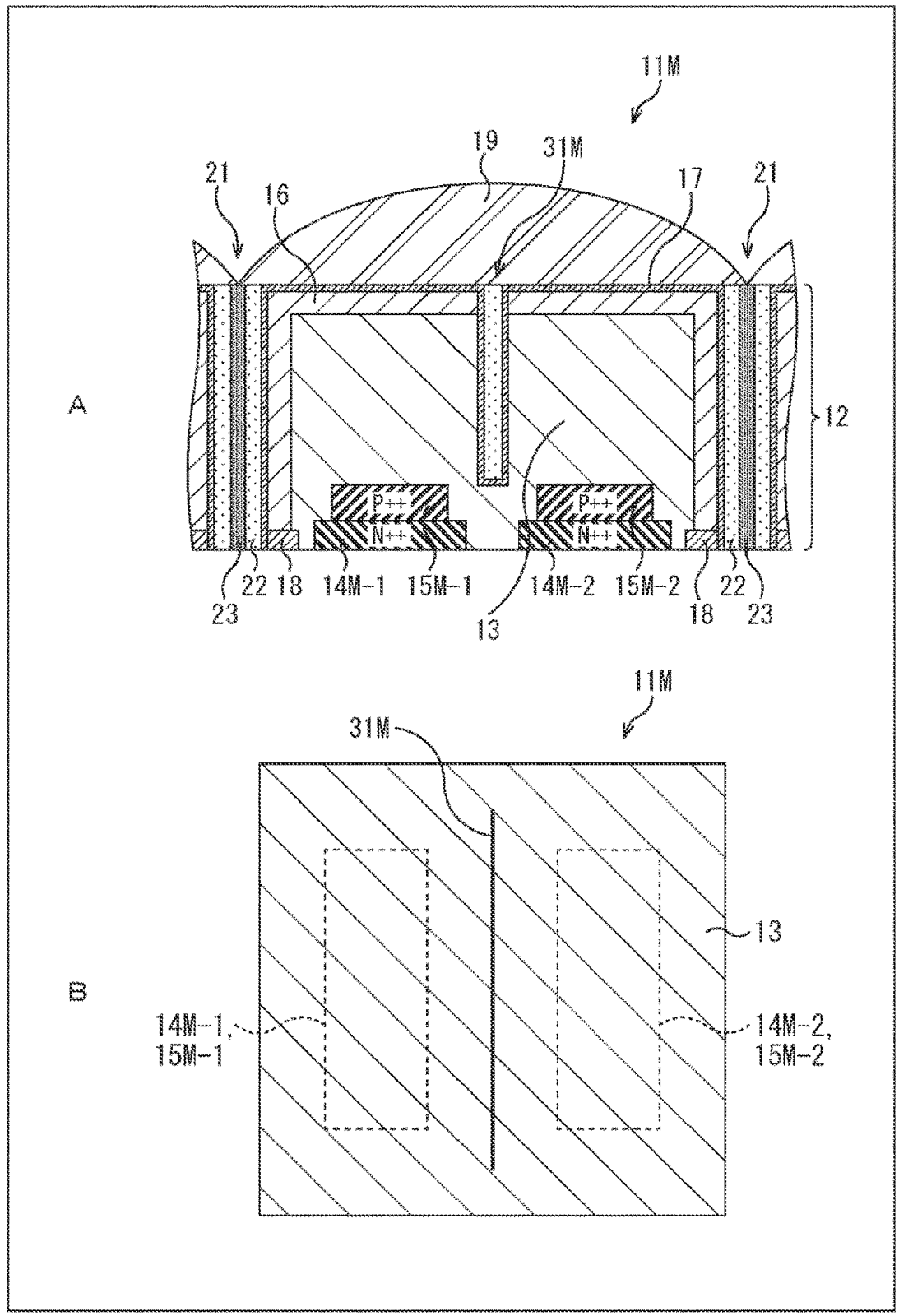
FIG. 12 is a cross-sectional view illustrating a ninth configuration example of the SPAD pixel.

FIG. 12 illustrates a cross-sectional configuration of a SPAD pixel 11M. Note that components common to the SPAD pixel 11M illustrated in FIG. 12 and the SPAD pixel 11 in FIG. 1 are denoted by the same reference numerals, and no detailed description will be given below of such components.

That is, the SPAD pixel 11M is the same in configuration as the SPAD pixel 11 in FIG. 1 in that the N-well 13, the hole accumulation layer 16, the pinning layer 17, and the high-concentration P-type diffusion layer 18 are provided in the sensor substrate 12. Furthermore, the SPAD pixel 11M has the on-chip microlens 19 placed on the light reception surface of the sensor substrate 12, and the SPAD pixels 11M adjacent to each other are separated by the inter-pixel separation part 21, in a similar manner to the SPAD pixel 11 in FIG. 1.

Then, the SPAD pixel 11M is different in configuration from the SPAD pixel 11 in FIG. 1 in that a plurality of N-type diffusion layers 14M and P-type diffusion layers 15M is provided in the sensor substrate 12, and an in-pixel trench structure 31M is disposed between the N-type diffusion layers 14M and P-type diffusion layers 15M. In the example illustrated in FIG. 12, an N-type diffusion layer 14M-1 and a P-type diffusion layer 15M-1, an N-type diffusion layer 14M-2, and a P-type diffusion layer 15M-2 are provided in the sensor substrate 12, and the in-pixel trench structure 31M is disposed between the N-type diffusion layer 14M-1 and the P-type diffusion layer 15M-1, and the N-type diffusion layer 14M-2 and the P-type diffusion layer 15M-2. Note that the in-pixel trench structure 31M has a configuration where the insulator 32 (see FIG. 1) is embedded in a trench extending from the back surface of the sensor substrate 12, and the pinning layer 17 is formed all over an outer peripheral surface of the in-pixel trench structure 31M.

The SPAD pixel 11M configured as described above is driven with the N-type diffusion layer 14M-1 and the P-type diffusion layer 15M-1, and the N-type diffusion layer 14M-2 and the P-type diffusion layer 15M-2 connected to a common cathode. Therefore, for example, when any one of the avalanche multiplication region between the N-type diffusion layer 14M-1 and the P-type diffusion layer 15-1M or the N-type diffusion layer 14M-2 and the P-type diffusion layer 15-2 between the N-type diffusion layer 14M-2 and the P-type diffusion layer 15-2 is brought into a quenched state, the SPAD pixel 11M is brought into a quenched state. It is therefore expected that, for example, photons incident on the SPAD pixel 11M undergo an avalanche reaction in the nearest avalanche multiplication region. Therefore, such a configuration makes it possible to reduce timing jitter of the SPAD pixel 11M and reduce a variation in breakdown voltage in the array.

Therefore, the SPAD pixel 11M can achieve performance better than the SPAD pixel 11 in FIG. 1.

<Tenth Configuration Example of SPAD Pixel>

Figure 13:
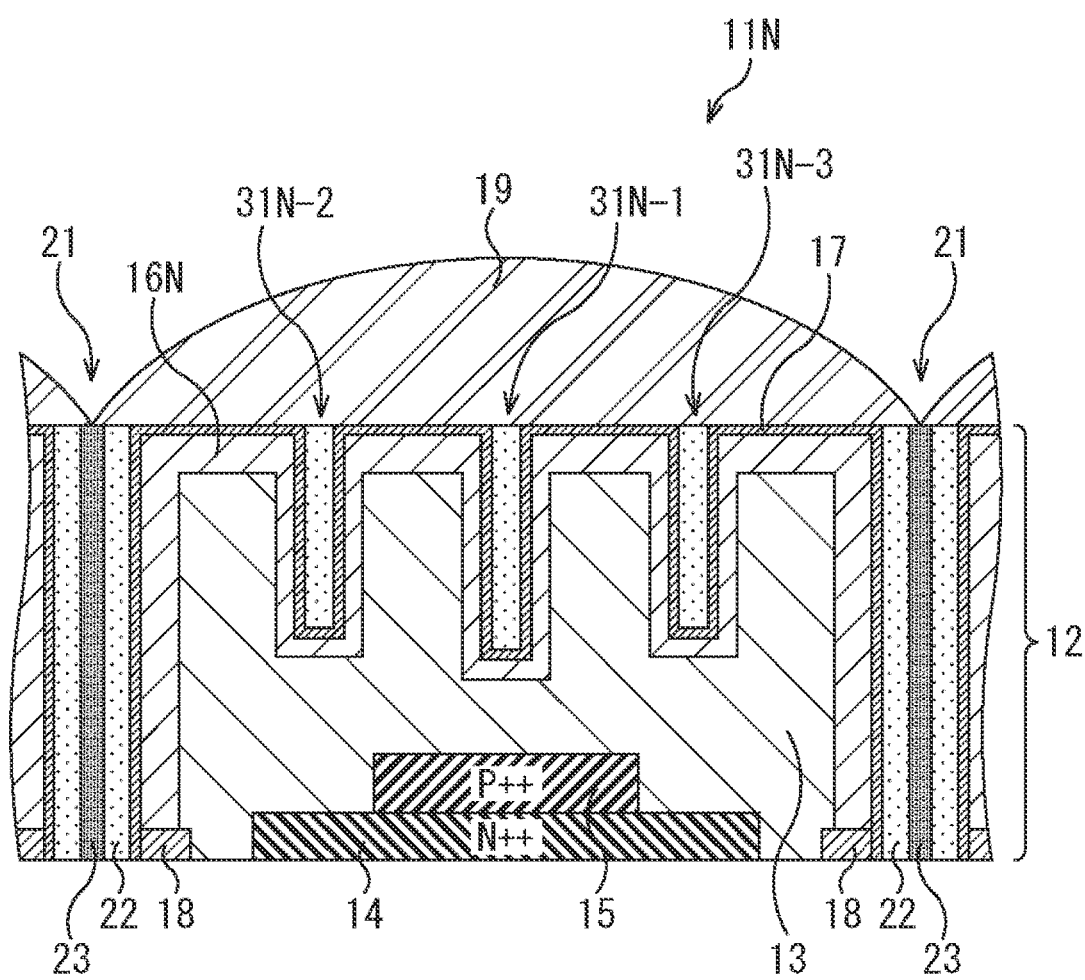
FIG. 13 is a cross-sectional view illustrating a tenth configuration example of the SPAD pixel.

FIG. 13 is a cross-sectional view illustrating a tenth configuration example of the SPAD pixel.

FIG. 13 illustrates a cross-sectional configuration of a SPAD pixel 11N. Note that components common to the SPAD pixel 11N illustrated in FIG. 13 and the SPAD pixel 11 in FIG. 1 are denoted by the same reference numerals, and no detailed description will be given below of such components.

That is, the SPAD pixel 11N is the same in configuration as the SPAD pixel 11 in FIG. 1 in that the N-well 13, the N-type diffusion layer 14, the P-type diffusion layer 15, the pinning layer 17, and the high-concentration P-type diffusion layer 18 are provided in the sensor substrate 12. Furthermore, the SPAD pixel 11N has the on-chip microlens 19 placed on the light reception surface of the sensor substrate 12, and the SPAD pixels 11N adjacent to each other are separated by the inter-pixel separation part 21, in a similar manner to the SPAD pixel 11 in FIG. 1.

Then, the SPAD pixel 11N is different in configuration from the SPAD pixel 11 in FIG. 1 in that a plurality of in-pixel trench structures 31N is provided in the pixel region, and a hole accumulation layer 16N is formed all over an outer peripheral surface of each of the in-pixel trench structures 31N. In the example illustrated in FIG. 13, the SPAD pixel 11N has a configuration where three in-pixel trench structures 31N-1 to 31N-3 are provided. Note that the in-pixel trench structures 31N-1 to 31N-3 each have a configuration where the insulator 32 (see FIG. 1) is embedded in a trench extending from the back surface of the sensor substrate 12, and the pinning layer 17 is formed all over an outer peripheral surface of each of the in-pixel trench structures 31N-1 to 31N-3. Then, the, the hole accumulation layer 16N is further provided outside the pinning layer 17.

For the SPAD pixel 11N configured as described above, for example, even in a case where there is concern about deterioration in dark current rate (DCR) due to an increase in damage caused by trench processing, providing the hole accumulation layer 16N all over the outer peripheral surface of each of the in-pixel trench structures 31N makes it possible to strengthen pinning in the vicinity of the trench. This allows the SPAD pixel 11N to suppress deterioration in DCR.

Note that the in-pixel trench structure 31N-1 disposed at the center of the SPAD pixel 11N may be brought close to the P-type diffusion layer 15 to strengthen pinning in the vicinity of the trench, for example.

The SPAD pixel 11N configured as described above and provided with the hole accumulation layer 16N all over the outer peripheral surface of each of the in-pixel trench structures 31N can achieve performance better than the SPAD pixel 11 in FIG. 1.

<Eleventh Configuration Example of SPAD Pixel>

An eleventh configuration example of the SPAD pixel will be described with reference to FIG. 14.

Figure 14:
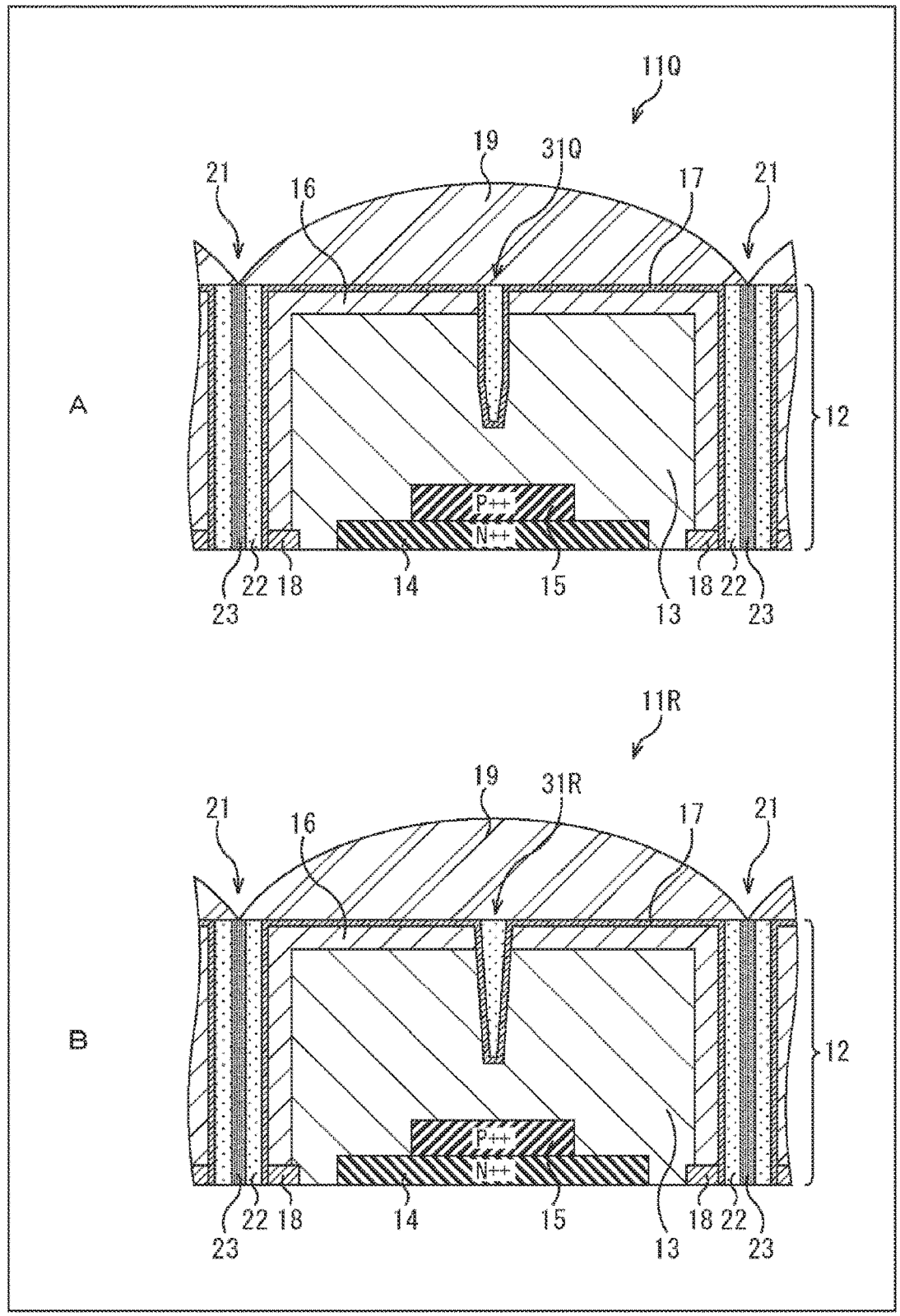
FIG. 14 is a cross-sectional view illustrating an eleventh configuration example of the SPAD pixel.

A of FIG. 14 illustrates a first variation of the eleventh configuration example of the SPAD pixel, and B of FIG. 14 illustrates a second variation of the eleventh configuration example of the SPAD pixel. Note that components common to a SPAD pixel 11Q illustrated in A of FIG. 14, a SPAD pixel 11R illustrated in B of FIG. 14, and the SPAD pixel 11 in FIG. 1 are denoted by the same reference numerals, and no detailed description will be given below of such components.

That is, the SPAD pixels 11Q and 11R are the same in configuration as the SPAD pixel 11 in FIG. 1 in that the N-well 13, the N-type diffusion layer 14, the P-type diffusion layer 15, the hole accumulation layer 16, the pinning layer 17, and the high-concentration P-type diffusion layer 18 are provided in the sensor substrate 12. Furthermore, the SPAD pixels 11Q and 11R each have the on-chip microlens 19 placed on the light reception surface of the sensor substrate 12, and the SPAD pixels 11Q adjacent to each other and the SPAD pixels 11R adjacent to each other are separated by the inter-pixel separation part 21, in a similar manner to the SPAD pixel 11 in FIG. 1.

Then, the SPAD pixels 11Q and 11R are different in configuration from the SPAD pixel 11 in FIG. 1 in that in-pixel trench structures 31Q and 31R each having a tapered shape are formed. Note that the in-pixel trench structures 31Q and 31R each have a configuration where the insulator 32 (see FIG. 1) is embedded in a trench extending from the back surface of the sensor substrate 12, and the pinning layer 17 is formed all over an outer peripheral surface of each of the in-pixel trench structures 31Q and 31R.

As illustrated in A of FIG. 14, the SPAD pixel 11Q is provided with the in-pixel trench structure 31Q, a region in the vicinity of a tip of the in-pixel trench structure 31Q having a tapered shape that becomes narrower toward the tip. Note that a region other than the region in the vicinity of the tip of the in-pixel trench structure 31Q has the same width.

As illustrated in B of FIG. 14, the SPAD pixel 11R is provided with the in-pixel trench structure 31R having, in its entirety, a tapered shape that becomes narrower toward the tip. That is, the in-pixel trench structure 31R has a shape without a region having the same width.

The SPAD pixels 11Q and 11R formed as described above and having the in-pixel trench structures 31Q and 31R formed in a tapered shape can have a structure where reflected light is easily directed to the avalanche multiplication region. As a result, the SPAD pixels 11Q and 11R can achieve performance better than the SPAD pixel 11 in FIG. 1.

<Twelfth Configuration Example of SPAD Pixel>

A twelfth configuration example of the SPAD pixel will be described with reference to FIG. 15.

Figure 15:
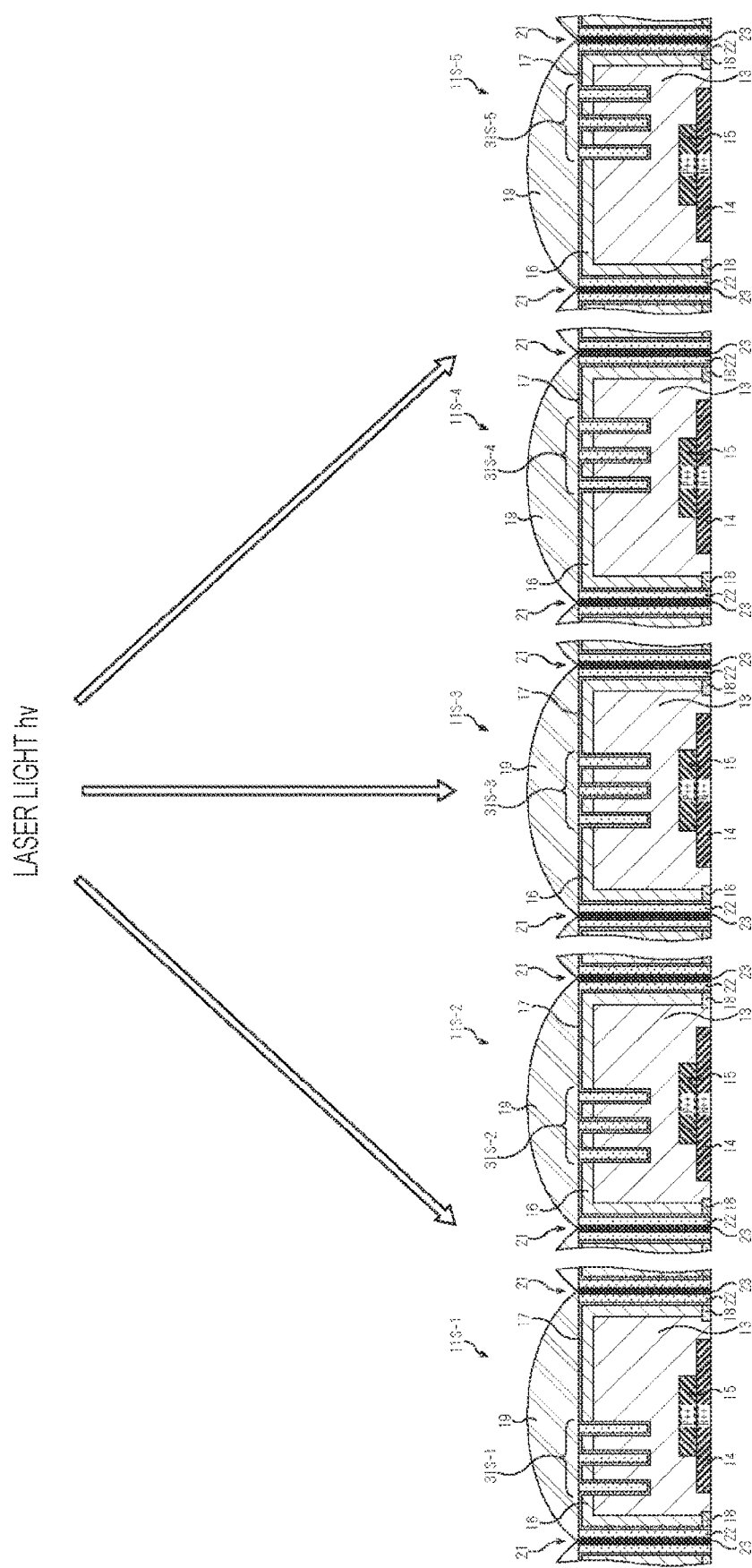
FIG. 15 is a cross-sectional view illustrating a twelfth configuration example of the SPAD pixel.

FIG. 15 illustrates a cross-sectional configuration of a SPAD pixel 11S. Note that components common to the SPAD pixel 11S illustrated in FIG. 2 and the SPAD pixel 11 in FIG. 1 are denoted by the same reference numerals, and no detailed description will be given below of such components.

That is, the SPAD pixel 11S is the same in configuration as the SPAD pixel 11 in FIG. 1 in that the N-well 13, the N-type diffusion layer 14, the P-type diffusion layer 15, the hole accumulation layer 16, the pinning layer 17, and the high-concentration P-type diffusion layer 18 are provided in the sensor substrate 12. Furthermore, the SPAD pixel 11S has the on-chip microlens 19 placed on the light reception surface of the sensor substrate 12, and the SPAD pixels 11S adjacent to each other are separated by the inter-pixel separation part 21, in a similar manner to the SPAD pixel 11 in FIG. 1.

Here, SPAD pixels 11S-1 to 11S-5 illustrated in FIG. 15 have a configuration where the SPAD pixel 11S-1 and the SPAD pixel 11S-5 are arranged at both ends of the pixel array, and the SPAD pixel 11 S-3 is disposed at the center of the pixel array. Then, the SPAD pixels 11S-1 to 11S-5 are arranged at positions based on in-pixel trench structures 31S-1 to 31S-5 obtained as a result of pupil correction in accordance with their respective locations.

As described above, applying pupil correction to the SPAD pixels 11S-1 to 11S-5 makes it possible to guide photons to the avalanche multiplication region so as to be optimum for each of the SPAD pixels 11S-1 to 11S-5 in accordance with an incident angle of corresponding light (laser light hv).

This allows the pixel array in which the SPAD pixels 11S-1 to 11S-5 are provided to achieve better performance as a whole.

<Configuration Example of Distance Image Sensor>

Figure 16:
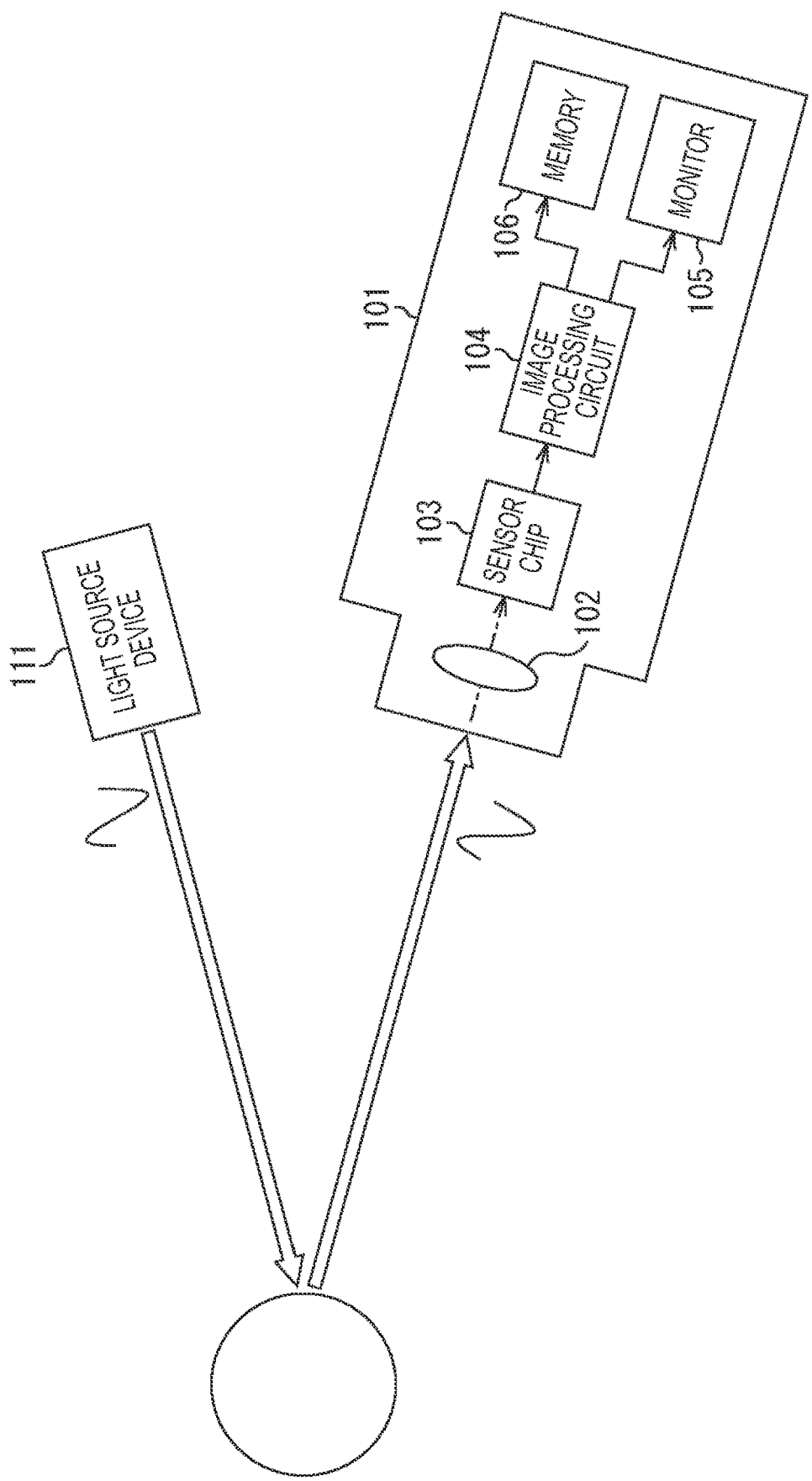
FIG. 16 is a block diagram illustrating a configuration example of a distance image sensor.

FIG. 16 is a block diagram illustrating a configuration example of a distance image sensor that is an electronic device using a sensor chip in which the SPAD pixels 11 of each of the above-described configuration examples are arranged in an array on a light reception surface.

As illustrated in FIG. 16, a distance image sensor 101 includes an optical system 102, a sensor chip 103, an image processing circuit 104, a monitor 105, and a memory 106. Then, the distance image sensor 101 can acquire a distance image according to a distance to a subject by receiving light (modulated light or pulsed light) projected from a light source device 111 toward the subject and reflected off a surface of the subject.

The optical system 102 includes one or a plurality of lenses, guides image light (incident light) from the subject to the sensor chip 103, and forms the image light as an image on a light reception surface (sensor unit) of the sensor chip 103.

In the sensor chip 103, the SPAD pixels 11 of each of the above-described configuration examples are arranged in an array, and a light reception signal (APD OUT) output from the sensor chip 103 is supplied to the image processing circuit 104.

The image processing circuit 104 performs image processing of constructing a distance image on the basis of the light reception signal supplied from the sensor chip 103. For example, the image processing circuit 104 performs operation processing of obtaining the distance to the subject on the basis of a timing at which a pulse indicating an arrival time of a single photon is generated in the light reception signal of each SPAD pixel 11 to obtain the distance for each SPAD pixel 11. Then, the image processing circuit 104 creates, on the basis of the distances, a distance image in which the distances to the subject detected by the plurality of SPAD pixels 11 are two-dimensionally arranged. The distance image (image data) obtained as a result of the image processing is supplied to and displayed on the monitor 105, or supplied to and stored (recorded) into the memory 106.

In the distance image sensor 101 configured as described above, applying the SPAD pixel 11 of each of the above-described configuration examples to use the light reception signal of the SPAD pixel 11 having better characteristics makes it possible to acquire a more accurate distance image, for example.

<Usage Example of Image Sensor>

Figure 17:
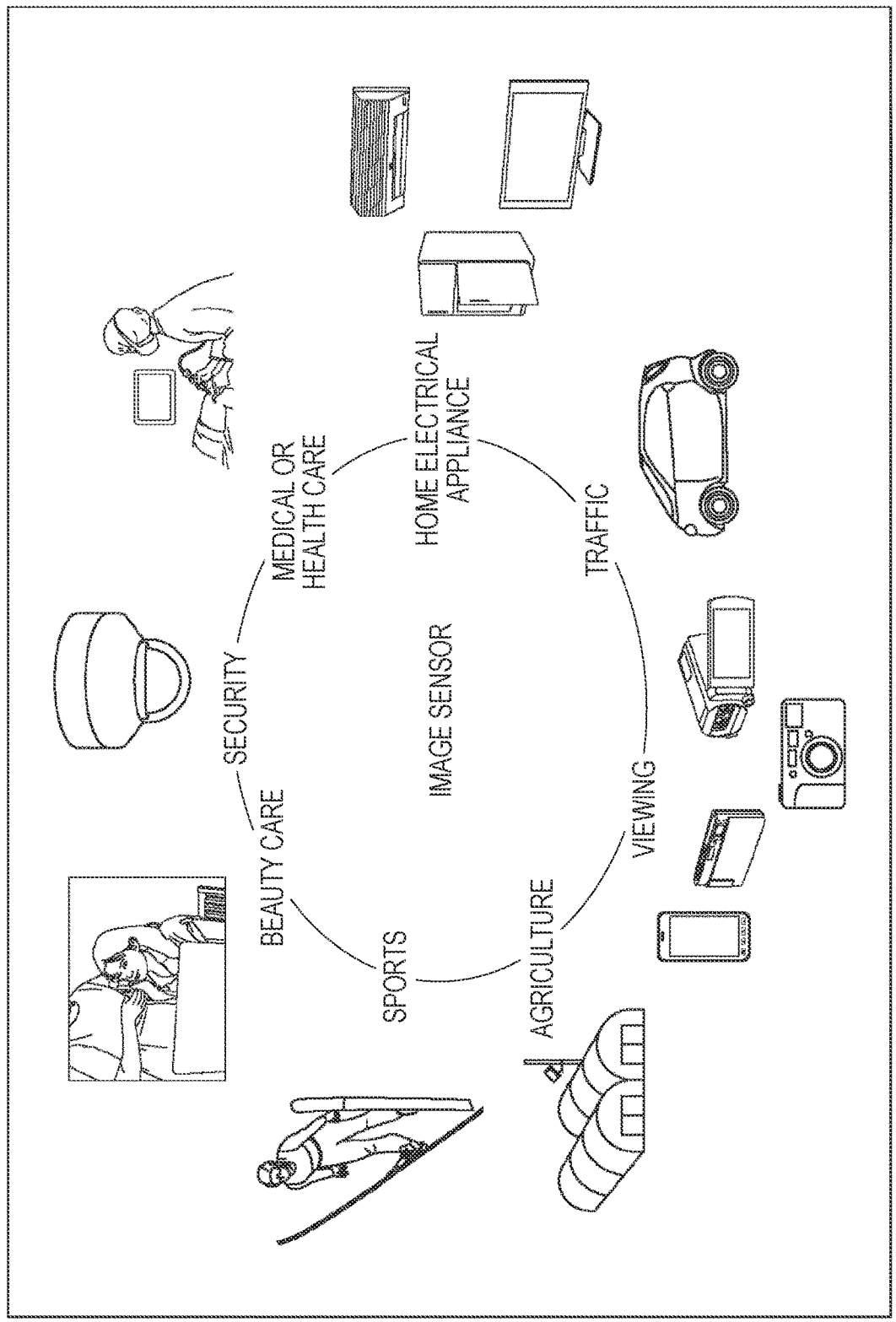
FIG. 17 is a diagram illustrating usage examples of an image sensor.

FIG. 17 is a diagram illustrating usage examples of the above-described image sensor (the distance image sensor 101 in FIG. 16).

The above-described image sensor is applicable to, for example, to various cases of sensing light such as visible light, infrared light, ultraviolet light, and X-rays as described below.

A device that captures an image to be used for viewing, such as a digital camera and a portable device with a camera function A device used for traffic, such as an in-vehicle sensor that captures images of a front view, rear view, surrounding view, inside view, and the like of an automobile for safe driving such as automatic braking and recognition of a driver's condition, a monitoring camera that monitors a traveling vehicle or a road, and a distance measurement sensor that measures a distance between vehicles A device used for home electrical appliances such as a television, a refrigerator, and an air conditioner in order to capture an image of a gesture of a user to control an appliance in accordance with the gesture A device used for medical care or health care, such as an endoscope and a device that performs angiography by receiving infrared light A device used for security, such as a surveillance camera for crime prevention and a camera for personal authentication A device used for beauty care, such as a skin measuring instrument that captures an image of skin and a microscope that captures an image of a scalp A device used for sports, such as an action camera and a wearable camera used for sports and the like A device used for agriculture, such as a camera for monitoring a condition of a field or crops <Example of Combination of Configurations>

Note that the present technology can also have the following configurations.

(1)

A light reception element including:

an avalanche multiplication region provided at a junction surface between an N-type diffusion layer and a P-type diffusion layer, the N-type diffusion layer and the P-type diffusion layer being provided on a side of a sensor substrate opposite from a light reception surface of the sensor substrate;

a hole accumulation layer provided so as to surround a lateral surface and a light reception surface of a well provided in the sensor substrate;

a pinning layer provided outside the hole accumulation layer; and an in-pixel trench structure provided in a pixel region, the pinning layer being formed all over an outer peripheral surface of the in-pixel trench structure.

(2)

In the light reception element according to the above (1), the in-pixel trench structure includes a trench extending from the light reception surface of the sensor substrate up to a depth where the in-pixel trench structure does not come into contact with either the N-type diffusion layer or the P-type diffusion layer, and an insulator in the trench.

(3)

In the light reception element according to the above (2), the in-pixel trench structure further includes a light shield disposed between the insulators.

(4)

In the light reception element according to any one of the above (1) to (3), a plurality of the in-pixel trench structures is arranged.

(5)

In the light reception element according to any one of the above (1) to (4), the plurality of the in-pixel trench structures is formed with a predetermined depth and width.

(6)

In the light reception element according to any one of the above (1) to (5), the plurality of the in-pixel trench structures is arranged at equal intervals or unequal intervals.

(7)

In the light reception element according to the above (4), the plurality of the in-pixel trench structures is arranged at intervals so as to make the intervals smaller at a center and make the intervals larger at outer sides.

(8)

In the light reception element according to the above (4), the plurality of the in-pixel trench structures is formed to be wider as a trench is deeper, and to be narrower as the trench is shallower.

(9)

In the light reception element according to any one of the above (1) to (8), the in-pixel trench structure is provided extending from a surface of the sensor substrate opposite from the light reception surface of the sensor substrate.

(10)

The light reception element according to any one of the above (1) to (9) further including a moth-eye structure provided on the light reception surface of the sensor substrate.

(11)

In the light reception element according to any one of the above (1) to (10), a plurality of the avalanche multiplication regions is provided, and the in-pixel trench structure is disposed between the avalanche multiplication regions.

(12)

In the light reception element according to any one of the above (1) to (11), the hole accumulation layer is provided outside the pinning layer provided all over the outer peripheral surface of the in-pixel trench structure.

(13)

In the light reception element according to any one of the above (1) to (12), the in-pixel trench structure has a tapered surface.

(14)

In the light reception element according to any one of the above (1) to (12), the in-pixel trench structure is disposed at a position determined on the basis of a result of pupil correction.

(15)

An electronic device including a sensor chip having light reception elements arranged in an array, in which each of the light reception elements includes:

an avalanche multiplication region provided at a junction surface between an N-type diffusion layer and a P-type diffusion layer, the N-type diffusion layer and the P-type diffusion layer being provided on a side of a sensor substrate opposite from a light reception surface of the sensor substrate;

a hole accumulation layer provided so as to surround a lateral surface and a light reception surface of a well provided in the sensor substrate;

a pinning layer provided outside the hole accumulation layer; and an in-pixel trench structure provided in a pixel region, the pinning layer being formed all over an outer peripheral surface of the in-pixel trench structure.

Note that the present embodiment is not limited to the above-described embodiments, and various modifications may be made without departing from the gist of the present disclosure. Furthermore, the effects described herein are merely examples and are not limited, and other effects may be provided.

REFERENCE SIGNS LIST

11 SPAD pixel
12 Sensor substrate
13 N-well
14 N-type diffusion layer
15 P-type diffusion layer
16 Hole accumulation layer
17 Pinning layer 18 High-concentration P-type diffusion layer
19 On-chip microlens
21 Inter-pixel separation part
22 Insulator
23 Light shield
31 In-pixel trench structure
32 Insulator
33 Light shield
41 Moth-eye structure

The invention claimed is:

1. A light reception element comprising:
an avalanche multiplication region located at a junction surface between an N-type diffusion layer and a P-type diffusion layer, the N-type diffusion layer and the P-type diffusion layer being provided on a side of a sensor substrate opposite from a light reception surface of the sensor substrate;
a hole accumulation layer arranged so as to surround a lateral surface and a light reception surface of a well provided in the sensor substrate;
a pinning layer located outside the hole accumulation layer; and
an in-pixel trench structure in a pixel region, the pinning layer being formed over an entirety of an outer peripheral surface of the in-pixel trench structure,
wherein the in-pixel trench structure extends from a surface of the sensor substrate opposite from the light reception surface of the sensor substrate at a location adjacent to a first side of the N-type diffusion layer, and
another in-pixel trench structure extends from the surface of the sensor substrate opposite from the light reception surface of the sensor substrate at a location adjacent to a second side of the N-type diffusion layer opposite to the first side of the N-type diffusion layer.

2. The light reception element according to claim 1, wherein the in-pixel trench structure includes a trench extending from the light reception surface of the sensor substrate up to a depth where the in-pixel trench structure does not come into contact with either the N-type diffusion layer or the P-type diffusion layer, and an insulator in the trench.

3. The light reception element according to claim 2, wherein the in-pixel trench structure further includes a light shield disposed in the trench between opposing surfaces of the insulator.

4. The light reception element according to claim 1, wherein the in-pixel trench structure is one of a plurality of in-pixel trench structures.

5. The light reception element according to claim 4, wherein the plurality of in-pixel trench structures is formed with a predetermined depth and width.

6. The light reception element according to claim 4, wherein the plurality of in-pixel trench structures is arranged at equal intervals or unequal intervals.

7. The light reception element according to claim 4, wherein the plurality of in-pixel trench structures are respectively arranged at intervals that are smaller at a center and larger at outer sides.

8. The light reception element according to claim 4, wherein the plurality of in-pixel trench structures are respectively arranged to be wider as a trench is deeper, and to be narrower as the trench is shallower.

9. The light reception element according to claim 1, further comprising a moth-eye structure on the light reception surface of the sensor substrate.

10. The light reception element according to claim 1, wherein the avalanche multiplication region is one of a plurality of avalanche multiplication regions is provided, and the in-pixel trench structure is disposed between two of the avalanche multiplication regions.

11. The light reception element according to claim 1, wherein the hole accumulation layer is arranged outside the pinning layer provided over an entirety of the outer peripheral surface of the in-pixel trench structure.

12. The light reception element according to claim 1, wherein the in-pixel trench structure has a tapered surface.

13. The light reception element according to claim 1, wherein the in-pixel trench structure is disposed at a position determined on a basis of a result of pupil correction.

14. An electronic device comprising
a sensor chip including light reception elements arranged in an array, wherein each of the light reception elements includes:
an avalanche multiplication region located at a junction surface between an N-type diffusion layer and a P-type diffusion layer, the N-type diffusion layer and the P-type diffusion layer being provided on a side of a sensor substrate opposite from a light reception surface of the sensor substrate;
a hole accumulation layer arranged so as to surround a lateral surface and a light reception surface of a well provided in the sensor substrate;
a pinning layer located outside the hole accumulation layer; and
an in-pixel trench structure in a pixel region, the pinning layer being formed over an entirety of an outer peripheral surface of the in-pixel trench structure,
wherein the in-pixel trench structure extends from a surface of the sensor substrate opposite from the light reception surface of the sensor substrate at a location adjacent to a first side of the N-type diffusion layer, and
another in-pixel trench structure extends from the surface of the sensor substrate opposite from the light reception surface of the sensor substrate at a location adjacent to a second side of the N-type diffusion layer opposite to the first side of the N-type diffusion layer.

15. The electronic device according to claim 14, wherein the in-pixel trench structure includes a trench extending from the light reception surface of the sensor substrate up to a depth where the in-pixel trench structure does not come into contact with either the N-type diffusion layer or the P-type diffusion layer, and an insulator in the trench.

16. The electronic device according to claim 15, wherein the in-pixel trench structure further includes a light shield disposed in the trench between opposing surfaces of the insulator.

17. The electronic device according to claim 14, wherein the in-pixel trench structure is one of a plurality of in-pixel trench structures.

18. The electronic device according to claim 17, wherein the plurality of in-pixel trench structures is formed with a predetermined depth and width.

19. The electronic device according to claim 17, wherein the plurality of in-pixel trench structures is arranged at equal intervals or unequal intervals.

20. The electronic device according to claim 17, wherein the plurality of in-pixel trench structures are respectively arranged at intervals that are smaller at a center and larger at outer sides.

* * * * *